(12) United States Patent
Yamanaka et al.

(10) Patent No.: US 8,890,213 B2
(45) Date of Patent: Nov. 18, 2014

(54) SEMICONDUCTOR WAFER, ELECTRONIC DEVICE, A METHOD OF PRODUCING SEMICONDUCTOR WAFER, AND METHOD OF PRODUCING ELECTRONIC DEVICE

(75) Inventors: Sadanori Yamanaka, Chiba (JP); Masahiko Hata, Ibaraki (JP); Noboru Fukuhara, Tsukuba (JP)

(73) Assignee: Sumitomo Chemical Company, Limited, Tokyo (JP)

(*) Notice: Subject to any disclaimer, the term of this patent is extended or adjusted under 35 U.S.C. 154(b) by 292 days.

(21) Appl. No.: 13/301,272

(22) Filed: Nov. 21, 2011

(65) Prior Publication Data
US 2012/0061730 A1  Mar. 15, 2012

Related U.S. Application Data

(63) Continuation-in-part of application No. PCT/JP2010/003371, filed on May 19, 2010.

(30) Foreign Application Priority Data

May 22, 2009  (JP) .................................. 2009-124656

(51) Int. Cl.
| | |
|---|---|
| *H01L 29/70* | (2006.01) |
| *H01L 29/66* | (2006.01) |
| *H01L 31/0304* | (2006.01) |
| *H01L 29/737* | (2006.01) |
| *H01L 21/02* | (2006.01) |
| *H01L 31/0312* | (2006.01) |
| *H01L 31/18* | (2006.01) |

(52) U.S. Cl.
CPC ...... *H01L 29/7371* (2013.01); *H01L 29/66318* (2013.01); *H01L 31/03044* (2013.01); *H01L 31/0304* (2013.01); *H01L 21/0245* (2013.01); *H01L 21/02521* (2013.01); *H01L 31/0312* (2013.01); *H01L 31/1852* (2013.01); *H01L 21/02546* (2013.01); *H01L 21/02381* (2013.01); *Y02E 10/544* (2013.01); *H01L 21/0262* (2013.01); *H01L 21/02639* (2013.01)

USPC ........ 257/197; 257/80; 257/183; 257/E21.09; 257/E29.024; 257/E29.171

(58) Field of Classification Search
CPC ............ H01L 21/0245; H01L 21/0262; H01L 21/0302; H01L 27/15; H01L 27/1446; H01L 31/0312
See application file for complete search history.

(56) References Cited

U.S. PATENT DOCUMENTS

| | | | |
|---|---|---|---|
| 4,614,564 A | | 9/1986 | Sheldon |
| 4,766,092 A | * | 8/1988 | Kuroda et al. .................. 117/95 |

(Continued)

FOREIGN PATENT DOCUMENTS

| | | |
|---|---|---|
| JP | 60-210831 A | 10/1985 |
| JP | 61-94318 A | 5/1986 |

(Continued)

OTHER PUBLICATIONS

English translation of International Preliminary Report on Patentability issued Dec. 22, 2011 in International application No. PCT/JP2010/003371.

(Continued)

*Primary Examiner* — Minh-Loan Tran
*Assistant Examiner* — Fazli Erdem
(74) *Attorney, Agent, or Firm* — Sughrue Mion, PLLC

(57) ABSTRACT

There is provided a semiconductor wafer including a base wafer that has an impurity region in which an impurity atom has been introduced into silicon, a plurality of seed bodies provided in contact with the impurity region, and a plurality of compound semiconductors each provided in contact with the corresponding seed bodies and lattice-matched or pseudo-lattice-matched to the corresponding seed bodies. The semiconductor wafer can further include an inhibitor provided on the base wafer and in which a plurality of apertures exposing at least a part of the impurity region are provided.

16 Claims, 19 Drawing Sheets

(56) References Cited

U.S. PATENT DOCUMENTS

| | | | |
|---|---|---|---|
| 5,036,374 A * | 7/1991 | Shimbo | 257/192 |
| 6,377,596 B1 * | 4/2002 | Tanaka et al. | 372/45.01 |
| 7,179,727 B2 | 2/2007 | Capewell et al. | |
| 2001/0045604 A1 * | 11/2001 | Oda et al. | 257/350 |
| 2002/0171089 A1 * | 11/2002 | Okuyama et al. | 257/88 |
| 2003/0143765 A1 * | 7/2003 | Ishibashi et al. | 438/21 |
| 2004/0023423 A1 * | 2/2004 | Kimura | 438/22 |
| 2004/0121507 A1 * | 6/2004 | Bude et al. | 438/93 |
| 2005/0245055 A1 * | 11/2005 | Capewell et al. | 438/509 |
| 2007/0057144 A1 * | 3/2007 | Asano | 250/200 |
| 2008/0001139 A1 * | 1/2008 | Augusto | 257/13 |
| 2008/0070355 A1 | 3/2008 | Lochtefeld | |
| 2008/0149935 A1 * | 6/2008 | Lee | 257/72 |
| 2009/0242935 A1 * | 10/2009 | Fitzgerald | 257/187 |
| 2010/0308376 A1 | 12/2010 | Takada | |
| 2011/0006343 A1 | 1/2011 | Hata et al. | |
| 2011/0006368 A1 | 1/2011 | Hata | |
| 2011/0006399 A1 | 1/2011 | Takada et al. | |
| 2011/0012175 A1 | 1/2011 | Takada | |
| 2011/0018030 A1 | 1/2011 | Takada et al. | |
| 2011/0037099 A1 | 2/2011 | Takada | |
| 2011/0180903 A1 | 7/2011 | Hata | |
| 2011/0180949 A1 | 7/2011 | Bierdel | |
| 2011/0186911 A1 | 8/2011 | Hata | |
| 2011/0266595 A1 | 11/2011 | Hata | |

FOREIGN PATENT DOCUMENTS

| | | | |
|---|---|---|---|
| JP | 61-135115 A | | 6/1986 |
| JP | 61-188927 A | | 8/1986 |
| JP | 63-252478 A | | 10/1988 |
| JP | 8-274376 A | | 10/1996 |
| JP | 09-213988 A | | 8/1997 |
| JP | 11-243056 A | | 9/1999 |
| JP | 2000-332229 | * | 11/2000 |
| JP | 2001-352093 A | | 12/2001 |
| JP | 2005-537672 A | | 12/2005 |
| JP | 2001-338988 A | | 12/2007 |

OTHER PUBLICATIONS

Notice of Reasons for Rejection issued Jul. 1, 2014 in Japanese Patent Application No. 2010-116778 with English translation.

* cited by examiner

600

SEMICONDUCTOR WAFER, ELECTRONIC DEVICE, A METHOD OF PRODUCING SEMICONDUCTOR WAFER, AND METHOD OF PRODUCING ELECTRONIC DEVICE

The contents of the following Japanese patent application and PCT patent application are incorporated herein by reference:
JP2009-124656 filed on May 22, 2009, and
PCT/JP2010/003371 filed on May 19, 2010.

TECHNICAL FIELD

The present invention relates to a semiconductor wafer, an electronic deVice, a method of producing a semiconductor wafer, and a method of producing an electronic device.

BACKGROUND ART

Patent Document 1 discloses a structure in which three LED stacks are formed on a silicon wafer, and the stacks contain a nitride Grope 3-5 compound semiconductor material and are lattice-matched to silicon. The above-stated Patent Document 1 is JP-8-274376A.

SUMMARY OF THE INVENTION

Problem to be Solved by the Invention

When a semiconductor wafer in which crystalline thin films including a Group 3-5 compound semiconductor are formed on a silicon wafer is used, it is possible to produce optical elements such as light emitting diodes (LEDs) or high-frequency amplifying elements such as hetrojunction bipolar transistors (HBTs) at a reduced cost. In order to improve the quality of these elements, it is necessary to improve the crystallinity of the compound semiconductor.

The inventors found that a compound semiconductor formed on a silicon wafer can have a fine crystallinity when an area of the compound semiconductor formed on the silicon wafer is limited to a very small region. When an electronic element such as an LED and an HBT is formed on the compound semiconductor, it is possible to produce an electronic device that includes the electronic element with a superior performance.

However, when an area where the compound semiconductor is formed is tiny, it is difficult to secure a region to arrange extension wires for the electronic element such as an LED and an HBT. For example, if extension wires, electrodes and so forth are disposed on the compound semiconductor, a region where can be used for a channel of an HBT or the like is limited to a small area. Therefore, it is preferable that wires and so forth be arranged without using a tiny compound semiconductor region.

Means for Solving Problem

For a solution to the above-mentioned problems, according to the first aspect related to the present invention, provided is one exemplary semiconductor wafer. The semiconductor wafer includes a base wafer that has an impurity region in which an impurity atom has been introduced into silicon, a plurality of seed bodies provided in contact with the impurity region, and a plurality of compound semiconductors each provided in contact with a corresponding seed body and lattice-matched or pseudo-lattice-matched to the corresponding seed body. The semiconductor wafer may further include an inhibitor provided on the base wafer and provided with a plurality of apertures in which at least a part of the impurity region is exposed. The seed bodies are, for example, each provided in the apertures respectively. The inhibitor inhibits crystal growth of the compound semiconductors.

The base wafer has a silicon region that is mainly made of a silicon atom, and the impurity region is, for example, in contact with the silicon region inside the base wafer. The base wafer has a first conductivity type impurity region that contains an impurity atom of a first conductivity type, and the impurity region may have a second conductivity type high-concentration impurity region that contains an impurity atom of a second conductivity type that is opposite to the first conductivity type in a concentration higher than the concentration of the impurity atom of the first conductivity type in the first conductivity type impurity region. The base wafer may include a second conductive type low-concentration impurity region that contains the impurity atom of the second conductive type in a concentration lower than the concentration of the second conductive type impurity region, and that is provided between the first conductive type impurity region and the second conductive type high-concentration impurity region. The impurity region can be formed so as to extend from one surface to another surface opposite thereto of the base wafer, the one surface being in contact with the plurality of the seed bodies.

The plurality of seed bodies each contain, for example, $C_xSi_yGe_zSn_{1-x-y-z}$ ($0 \le x<1$, $0 \le y \le 1$, $0 \le z \le 1$, and $0 < x+y+z \le 1$). The base wafer is, for example, a Si wafer or an SOI wafer. The resistivity of the impurity region is not less than 0.0001 $\Omega \cdot cm$ and not more than 1 $\Omega \cdot cm$. The semiconductor wafer may further include a laterally grown compound semiconductor that has been laterally grown on the inhibitor using at least one compound semiconductor of the plurality of compound semiconductors as a nucleus.

According to the second aspect related to the present invention, provided is an electronic device. The electronic device includes a compound semiconductor element provided on at least one of the plurality of compound semiconductors in the above-mentioned semiconductor wafer, the compound semiconductor element has a plurality of terminals, and at least one terminal of the plurality of terminals is electrically coupled to the impurity region via at least one of the seed bodies that are in contact with the compound semiconductor on which the compound semiconductor element is provided.

The electronic device may include a first compound semiconductor element provided on a first compound semiconductor of the plurality of compound semiconductors, and a second compound semiconductor element provided on a second compound semiconductor of the plurality of compound semiconductors, the second compound semiconductor being different from the first compound semiconductor. Here, at least one of the terminals of the first compound semiconductor element is electrically coupled to at least one of the terminals of the second compound semiconductor element via the impurity region. At least one of the compound semiconductor elements provided in the plurality of compound semiconductors can be a heterojunction bipolar transistor, and a collector of the heterojunction bipolar transistor can be electrically coupled to the impurity region via at least one of the seed bodies.

At least one of the compound semiconductor elements provided in the plurality of compound semiconductors can be a heterojunction bipolar transistor, and an emitter of the heterojunction bipolar transistor can be electrically coupled to the impurity region via at least one of the seed bodies. At least one of the first compound semiconductor element or the second compound semiconductor element can be a heterojunction bipolar transistor in which an emitter, base or collector is a common terminal, at least one of the first compound semiconductor element or the second compound semiconductor element other than the heterojunction bipolar transistor can be a sensor element having a common terminal and an output terminal, and the common terminal of the heterojunction bipolar transistor can be electrically coupled to the common terminal of the sensor element via the impurity region. The heterojunction bipolar transistor amplifies a signal transmitted from the output terminal of the sensor element.

The electronic device may further include a silicon element provided in a first conductivity type impurity region that is provided in the base wafer and contains an impurity atom of a first conductivity type, the silicon element having a plurality of terminals and including an active region mainly made of a silicon atom. Here, at least one of the terminals of the silicon element can be electrically coupled to at least one of the terminals of the compound semiconductor element provided in the plurality of the compound semiconductors via the impurity region.

According to the third aspect related to the present invention, provided is a method of producing a semiconductor wafer. The method includes preparing a base wafer that has an impurity region in which an impurity atom has been introduced into silicon, forming a plurality of seed bodies in contact with the impurity region, heating the seed bodies; and forming, on the heated seed bodies, a compound semiconductor that is lattice-matched or pseudo-lattice-matched to the seed bodies. In preparing the base wafer, a mask pattern is formed on a surface of the base wafer, and a region defined by the mask pattern is doped with the impurity atom in a high concentration.

In preparing the base wafer, for example, an inhibitor that inhibits crystal growth is formed on a surface of the base wafer, an aperture in which at least a part of the base wafer is exposed is formed in the inhibitor, and a region exposed in the aperture in the base wafer is doped with the impurity atom in a high concentration. The method may further in include laterally growing a laterally grown compound semiconductor on the inhibitor using the compound semiconductor as a nucleus.

According to the fourth aspect related to the present invention, provided is a method of producing an electronic device. The method includes producing a semiconductor wafer by preparing a base wafer that has an impurity region in which an impurity atom has been introduced into silicon, forming a plurality of seed bodies in contact with the impurity region, heating the seed bodies, and forming, on the heated seed bodies, a compound semiconductor that is lattice-matched or pseudo-lattice-matched to the seed bodies, and forming, in the compound semiconductor, a compound semiconductor element in which at least one terminal is electrically in the compound semiconductor, a compound semiconductor element in which at least one terminal is electrically coupled to the impurity region via at least one of the seed bodies.

MODE FOR CARRYING OUT THE INVENTION

Figure 1:
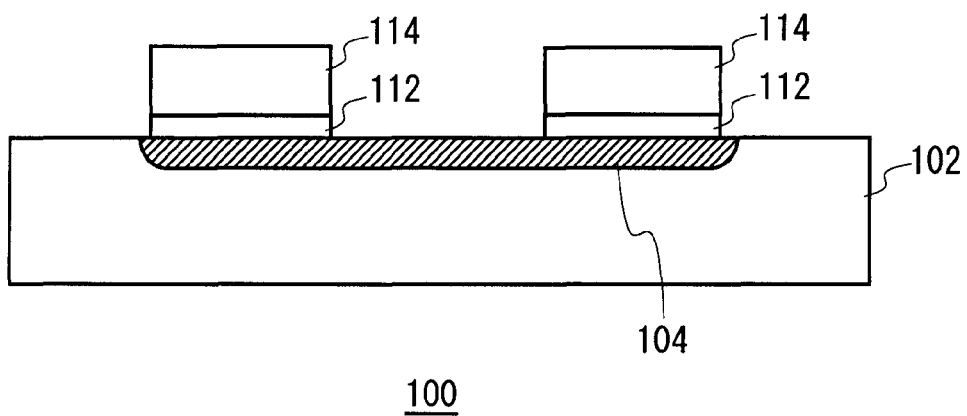
FIG. 1 illustrates an example of a cross section of a semiconductor wafer 100.

FIG. 1 illustrates an example of a cross section of a semiconductor wafer 100. The semiconductor wafer 100 includes a base wafer 102, a seed body 112, and a compound semiconductor 114.

The base wafer 102 has an impurity region 104 in which an impurity atom has been introduced into silicon. Since an impurity atom has been introduced, carriers (free electrons or free holes) are generated in the impurity region 104 and the region has a low resistivity compared to silicon in which no impurity atom is introduced. The resistivity of the impurity region 104 is, for example, not less than 0.0001 Ω·cm and not more than 1 Ω·cm, and preferably, not less than 0.0001 Ω·cm and not more than 0.2 Ω·cm. The base wafer 102 can have a silicon region that has a higher resistivity than the resistivity of the impurity region 104. The resistivity of the silicon region is, for example, equal to or more than 100 Ω·cm.

The impurity region 104 is provided inside the wafer. The impurity region 104 is, for example, an N-type high-concentration impurity region or a P-type high-concentration impurity region which is formed by heavily doping an N-type or P-type impurity atom into a part of the silicon region. The term "high-concentration" here refers to an impurity atom concentration at which the resistivity of the impurity region can be set to not less than 0.0001 Ω·cm and not more than 1 Ω·cm. As a method of doping an impurity atom, there are thermal diffusion, ion implantation and so forth.

The base wafer 102 has silicon crystal in its surface. Here, "the base wafer 102 has silicon crystal in its surface" means that the base wafer 102 has a region consisting of silicon atoms at least in the surface of the base wafer. For example, the whole of the base wafer 102 can be made of silicon atoms, in other words, the base wafer 102 can be a silicon wafer. The base wafer 102 can have a structure such as silicon-on-insulator (SOI) in which a silicon layer is formed on an insulating layer.

Note that the base wafer 102 can have a silicon layer which is grown on a sapphire or glass wafer that has a different composition from silicon. Moreover, the base wafer 102 can have a thin silicon oxide layer such as a native oxide layer or a thin nitride silicon layer formed on the silicon layer at the wafer surface.

The semiconductor wafer 100 has a plurality of seed bodies 112 provided on the base wafer 102. Each of the seed bodies 112 is provided in contact with the impurity region 104. The compound semiconductor 114 is provided in contact with the corresponding seed body 112, and is lattice-matched or pseudo-lattice-matched to the corresponding seed body 112. One compound semiconductor 114 can be provided on each of the seed bodies 112, or two or more compound semiconductors 114 can be provided on each of the seed bodies 112.

In this specification, "pseudo-lattice-matching (matched)" means the state which is not a perfect lattice matching (matched) but in which a difference in the lattice constant between two contacting semiconductors is small and the two contacting semiconductors can be disposed on top of each other to the extent where defects due to lattice mismatch are less represented. At this point, the crystal lattice of each semiconductor deforms within its elastic deformable range, and the difference in the lattice constant is absorbed. For example, a stacking structure of Ge and GaAs or Ge and InGaP within a limit thickness for lattice relaxation is referred to as the pseudo-lattice matching.

At least one seed body among the plurality of seed body 112 is electrically coupled to the impurity region 104. For example, a carrier can travel between the seed body 112 and the impurity region 104. The seed body 112 and the impurity region 104 can be electrically coupled by electromagnetic induction. The seed body 112 includes, for example, $C_x Si_y Ge_z Sn_{1-x-y-z}$ ($0 \le x < 1$, $0 \le y \le 1$, $0 \le z \le 1$, and $0 < x+y+z \le 1$). For instance, the seed body 112 is a Ge crystal, a SiGe crystal or a GeSn crystal.

The seed body 112 is, for example, a semiconductor that provides a fine seed plane for the compound semiconductor 114. The seed body 112 prevents an adverse effect of the impurity existing on the surface of the base wafer 102 to the crystallinity of the compound semiconductor 114. The seed body 112 can includes more than one layer. For example, the seed body 112 includes an impurity atom that exhibits the same conductivity type as the conductivity type of the impurity region 104.

The seed body 112 can include an interface region of which composition is $C_{x2} Si_{y2} Ge_{z2} Sn_{1-x2-y2-z2}$ ($0 \le x2 < 1$, $0 \le y2 \le 1$, $0 \le z2 \le 1$, and $0 < x2+y2+z2 \le 1$) and provided in the base wafer 102 so as to be in contact with the interface between the base wafer 102 and the seed body 112. The silicon composition y of the seed body 112 and the silicon composition y2 of the interface region satisfy, for example, the relation y2>y.

The seed body 112 is formed by, for example, an epitaxial growth method. An example of the epitaxial growth method includes a chemical vapor deposition method (referred to as a CVD method), a metal organic chemical vapor deposition method (referred to as a MOCVD method), a molecular beam epitaxy method (referred to as a MBE method) and an atomic layer deposition method (referred to as an ALD method). The plurality of seed bodies 112 are formed such that they are separately from each other with certain distances therebetween. The seed bodies can be formed by, for example, forming a film that has the same composition as the seed body 112 on the base wafer 102, and then etching the film using a photolithography method.

The seed body 112 is preferably heated after it is formed on the base wafer 102. Lattice defects such as dislocation could occur inside the seed body 112 due to the difference in the lattice constant between the base wafer 102 and the seed body 112. The defect travels inside the seed body 112, for example, when the seed body 112 is heated and annealed. The defect travels inside the seed body 112 and then is captured by a gettering sink and so forth at the interface of the seed body 112 or inside the seed body 112. As a result, it is possible to reduce defects in the seed body 112 by heating the seed body 112, resulting in the improvement of the crystallinity of the seed body 112.

The seed body 112 can be formed by heating amorphous or polycrystalline $C_x Si_y Ge_z Sn_{1-x-y-z}$ ($0 \le x < 1$, $0 \le y \le 1$, $0 \le z \le 1$, and $0 < x+y+z \le 1$). The heating process to heat the seed body 112 can also serve as a thermal diffusion process for the impurity region 104 formation or an annealing process to activate implanted impurity atoms.

An area of the base of the seed body 112 is, for example, 1 mm$^2$ or less. The area of the base of the seed body 112 can be 1,600 μm$^2$ or less. The area of the base of the seed body 112 can be 900 μm$^2$ or less. The widest dimension of the base of the seed body 112 is, for example, 80 μm or less. The widest dimension of the base of the seed body 112 can be 40 μm or less.

The compound semiconductor 114 is, for example, a Group 4 compound semiconductor, a Group 3-5 compound semiconductor, or Group 2-6 compound semiconductor. When the compound semiconductor 114 is a Group 3-5 compound semiconductor, the compound semiconductor 114 is GaAs, GaN, InP or the like.

The semiconductor wafer 100 can have other semiconductor layer between the compound semiconductor 114 and the seed body 112. For example, the semiconductor wafer 100 has a buffer layer and so forth between the compound semiconductor 114 and the seed body 112. The compound semiconductor 114 can be a stacked structure that includes semiconductor layers having different compositions, doping concentrations and thicknesses. For example, when the compound semiconductor 114 has a P-type semiconductor layer and an N-type semiconductor layer, a diode having a PN junction can be formed. The compound semiconductor 114 is formed by, for example, an epitaxial growth method. An example of the epitaxial growth method includes CVD, MOCVD, MBE and ALD methods.

Figure 2:
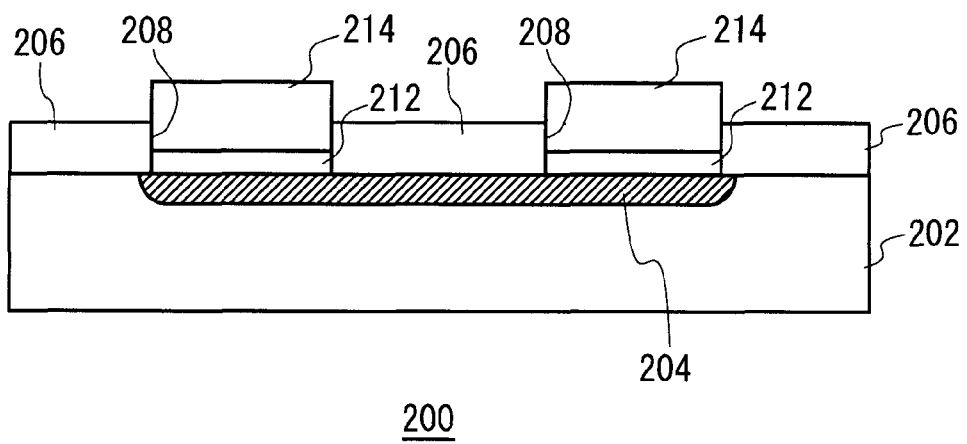
FIG. 2 illustrates an example of a cross section of a semiconductor wafer 200.

FIG. 2 illustrates an example of a cross section of a semiconductor wafer 200 according to another embodiment. The semiconductor wafer 200 includes a base wafer 202, an inhibitor 206, a seed body 212, and a compound semiconductor 214. The base wafer 202 has an impurity region 204.

The base wafer 202 corresponds to the base wafer 102 shown in FIG. 1. The impurity region 204 corresponds to the impurity region 104. The seed body 212 corresponds to the seed body 112. The compound semiconductor 214 corresponds to the compound semiconductor 114. Therefore, explanations for the same structures or features in the semiconductor wafer 100 will be hereunder omitted.

The inhibitor 206 is formed on the base wafer 202. An aperture 208 in which at least a portion of the impurity region 204 is exposed is formed in the inhibitor 206. The aperture 208 extends to the surface of the base wafer 202. A plurality of the apertures 208 can be formed in the inhibitor 206. The seed body 212 is formed inside at least one of the plurality of apertures 208.

The inhibitor 206 inhibits crystal growth. For example, when crystal of semiconductor is grown by the epitaxial growth method, the epitaxial growth of the semiconductor crystal is inhibited on the surface of the inhibitor 206. Consequently, the crystal of the semiconductor is selectively grown in the aperture 208 by the epitaxial growth method.

The inhibitor 206 is, for example, a silicon oxide layer, a silicon nitride layer, a silicon oxynitride layer, or stacked layers including these layers. The thickness of the inhibitor 206 is, for example, 0.001 μm to 5 μm. The inhibitor 206 is formed by, for example, a thermal oxidation method, a CVD method or the like.

Figure 3:
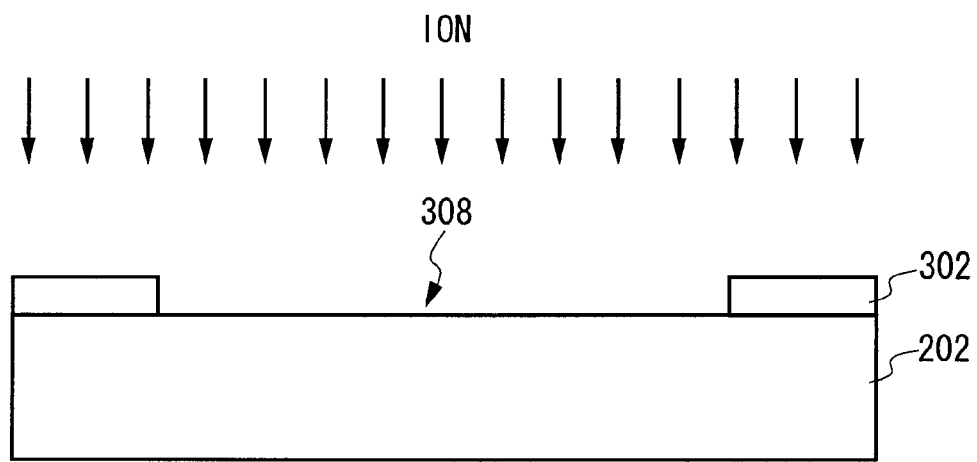
FIG. 3 illustrates a cross section example of the semiconductor wafer 200 during a production process.
Figure 4:
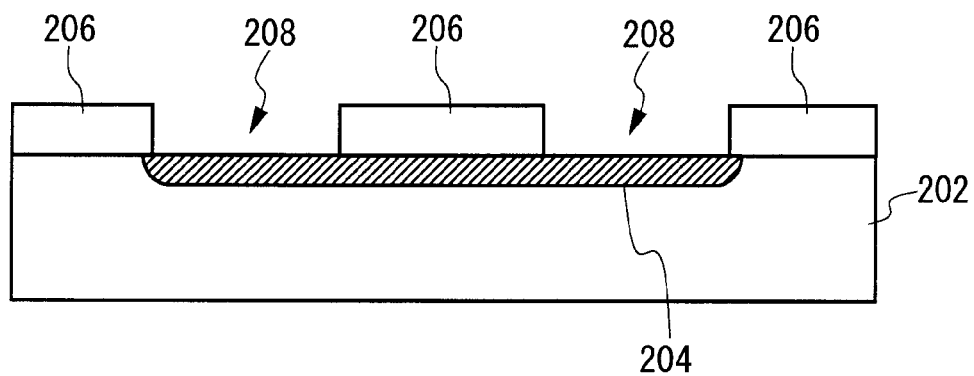
FIG. 4 illustrates another cross section example of the semiconductor wafer 200 during the production process.
Figure 5:
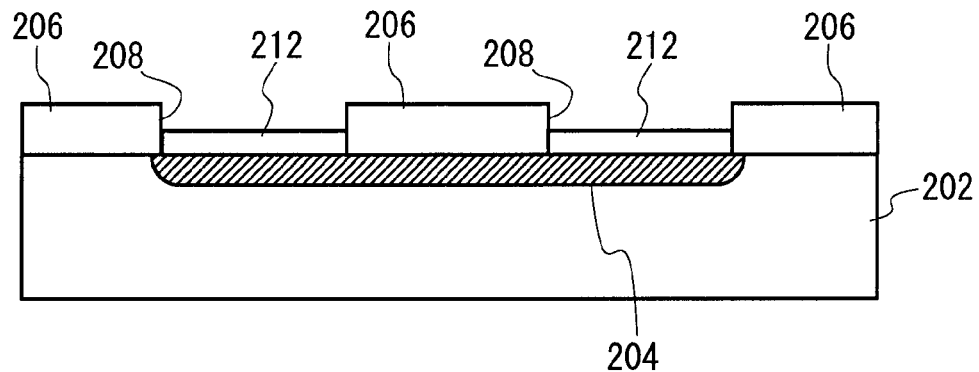
FIG. 5 illustrates another cross section example of the semiconductor wafer 200 during the production process.

FIGS. 3 to 5 illustrate cross section examples of the semiconductor wafer 200 during a production process. A method of producing the semiconductor wafer 200 includes preparing the base wafer 202 that has the impurity region 204 in which an impurity atom has been introduced into silicon; forming a plurality of seed bodies 212 such that they are in contact with the impurity region 204; heating the plurality of seed bodies 212; and forming, on the heated seed bodies 212, a compound semiconductor that is lattice-matched or pseudo-lattice-matched to the seed bodies 212.

When the base wafer 202 is prepared, a mask pattern for forming the impurity region is formed on the surface of the wafer at least which surface is formed of silicon crystal. A photoresist mask pattern, a silicon oxide, a silicon nitride, a silicon oxynitride, or stacked layers of these layers can be used as the mask pattern. The silicon oxide, silicon nitride and so forth can be formed by a thermal oxidation method, a CVD method or the like. The mask pattern is formed by a photolithography method.

For example, when the impurity region 204 in which an impurity atom is heavily doped is formed on the base wafer 202, photoresist is applied on the surface of the base wafer 202, an aperture 308 is then formed at the position where the impurity region 204 is to be provided by a photolithography method, and then a mask pattern 302 as shown in FIG. 3 can be obtained.

Subsequently, the impurity region 204 is formed by doping impurity atoms heavily into a region defined by the mask pattern on the base wafer 202. For example, as illustrated in FIG. 3, impurity atom ions are implanted, and the impurity region 204 as illustrated in FIG. 4 is formed in the position corresponding to the aperture 308 in the base wafer 202. An example of an N-type impurity atom includes P, As, Sb, S, Se, Te and so forth. An example of a P-type impurity atom includes B, Al, Ga, In, Mg, Zn and so forth.

When the base wafer 202 is prepared, the inhibitor 206 that inhibits crystal growth is formed on the wafer, and the aperture 208 in which at least a part of the impurity region 204 is exposed can be formed in the inhibitor 206. For example, a silicon oxide film which serves as the inhibitor 206 is formed on the whole surface of the base wafer 202 by a thermal oxidation method. Referring to FIG. 4, a plurality of the apertures 208 in each of which at least a part of the impurity region 204 is exposed can be formed in the silicon oxide film by a photolithography method such as etching.

When the seed body 212 is formed, the seed body 212 is formed in the aperture such that it is in contact with the impurity region 204 at the bottom of the aperture. For example, as illustrated in FIG. 5, the seed body 212 is formed in the aperture 208 so as to be in contact with the impurity region 204 by a selective epitaxial growth method. An example of the epitaxial growth method includes CVD, MOCVD, MBE and ALD methods. A Ge crystal, a SiGe crystal or a GeSn crystal can be epitaxially grown as the seed body 212 by a CVD method.

When the seed body 212 is formed, an impurity atom can be doped into the seed body 212. For example, when the seed body 212 is made of SiGe crystal, Group 5 atom such as P, As and Sb can be used as an N-type impurity atom. Group 3 atom such as B and Ga can be used as a P-type impurity atom.

When the seed body 212 is heated, the seed body 212 is heated and annealed. By heating the seed body, it is possible to reduce lattice defects such as dislocation generated inside the seed body 212 due to a difference in the lattice constant between the base wafer 202 and the seed body 212, and therefore the crystallinity of the seed body 212 can be improved. When the seed body 212 is heating, more than one heating process can be repeatedly performed. For example, after high-temperature heating is performed on the seed body 212 at a temperature that does not reach to the melting point of the seed body 212, low-temperature heating is performed at a temperature that is lower than the temperature of the high-temperature heating. These two-step heating process can be repeated more than one time.

When the seed body 212 contains $Si_xGe_{1-x}$ ($0 \leq x < 1$), the temperature and time duration of the high-temperature heating are, for example, 800° C. to 900° C. and 2 to 10 minutes. The temperature and time duration of the low-temperature heating are, for example, 650° C. to 780° C. and 2 to 10 minutes.

When the compound semiconductor is formed, a compound semiconductor that is in contact with the heated seed body 212 and lattice-matched or pseudo-lattice-matched to the seed body 212 is formed. For example, as illustrated in FIG. 2, the compound semiconductor 214 is epitaxially grown selectively on the seed body 212. When a plurality of the seed bodies 212 are formed, the compound semiconductor 214 can be formed on each of the seed bodies 212.

An example of the epitaxial growth method includes CVD, MOCVD, MBE and ALD methods. For example, when the compound semiconductor 214 is a Group 3-5 compound semiconductor such as GaAs, AlGaAs, InGaP and the like, the compound semiconductor 214 can be epitaxially grown using a MOCVD method. For example, after the atmosphere inside an MOCVD reactor is sufficiently replaced by high-purity hydrogen, heating of the base wafer 202 that has the seed body 212 is started. A wafer temperature at the time of crystal growth can be, for example, any temperature between 450° C. to 800° C. When the temperature of the base wafer 202 is settled to an adequate temperature, an arsenic source or a phosphorus source is introduced into the reactor, and then a gallium source, an aluminum source or an indium source is subsequently introduced into the reactor to form the compound semiconductor 214 by an epitaxial growth method.

As the Group 3 element source, it is possible to use trimethyl gallium (TMG), trimethyl aluminium (TMA), trimethyl indium (TMI) or the like. As a Group 5 element source gas, it is possible to use arsine ($AsH_3$), tertiary butyl arsine ($(CH_3)_3CAsH_2$), phosphine ($PH_3$), tertiary butyl phosphine ($(CH_3)_3CPH_2$) or the like. Conditions for the epitaxial growth are, for example, a pressure inside the reactor of 0.1 atm, a growth temperature of 650° C. and a growth rate of 0.1 to 3 μm/hr. After a GaAs is deposited to around 30 nm thick under the epitaxial growth conditions of a pressure inside the reactor of 0.1 atm, a growth temperature of 550° C. and a growth rate of 0.1 μm/hr to 1 μm/hr, the growth is then temporally suspended but the arsenic source atmosphere is retained and the temperature is raised to 650° C. to realize the epitaxial growth conditions of a pressure inside the reactor of 0.1 atm, a growth temperature of 650° C. and a growth rate of 0.1 μm/hr to 3 μm/hr. A carrier gas used for the source is, for example, high-purity hydrogen.

Atoms forming the impurity region 204, the seed body 212 and the compound semiconductor 214 can be doped into each other's layer. For example, when Ge crystal is grown as the seed body 212 on the base wafer 202 and the compound semiconductor 214 is then grown on the Ge crystal, Ge atoms can be diffused into the compound semiconductor 214 while the compound semiconductor 214 is growing.

When re-vaporization of Ge atoms from the Ge crystal included in the seed body 212 occurs during heating of the seed body 212, the residual Ge atoms can be introduced into the compound semiconductor 214 in the crystal growth state of the compound semiconductor 214. The Ge atom in the compound semiconductor 214 acts as an N-type impurity and reduces the resistance of the compound semiconductor 214. Therefore, by adequately selecting conditions, it is possible to adjust the interface resistance between the impurity region 204 and the seed body 212 or between the seed body 212 and the compound semiconductor 214 to obtain a resistance that corresponds to a design value for the device formed in the semiconductor wafer 200.

Figure 6:
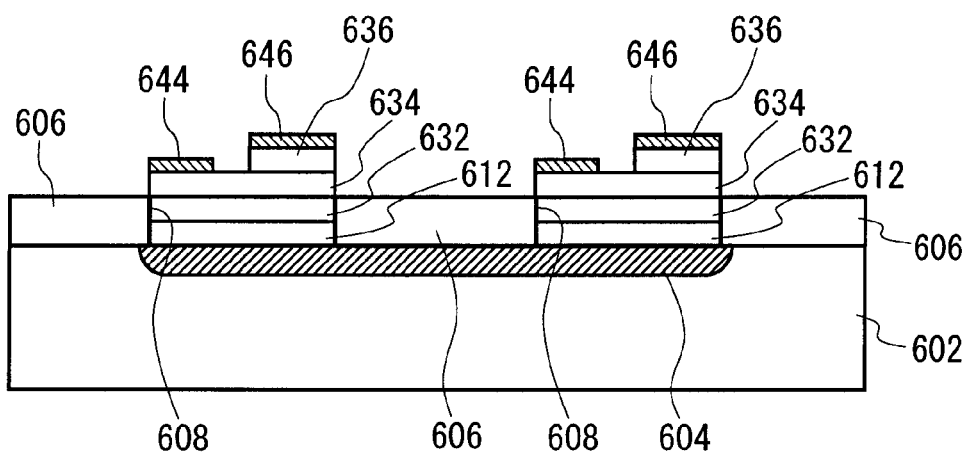
FIG. 6 illustrates an example of a cross section of an electronic device 600.

FIG. 6 illustrates an example of a cross section of an electronic device 600. The electronic device 600 includes a base wafer 602, an inhibitor 606 in which an aperture 608 is provided, a seed body 612, and a semiconductor 632 for a collector, a semiconductor 634 for a base, a semiconductor 636 for an emitter, a base electrode 644, and an emitter electrode 646. The base wafer 602 has an impurity region 604.

The electronic device 600 has two seed bodies 612. Two heterojunction bipolar transistors (HBTs) are formed from the semiconductors 632 for a collector, the semiconductors 634 for a base, the semiconductors 636 for an emitter and so forth together that are formed directly or indirectly on the two seed bodies 612. The HBT is an example of the compound semiconductor element. The two semiconductors 632 for the collectors of the HBTs are electrically coupled to the impurity region 604 via the seed bodies 612.

In the electronic device 600, the two semiconductors 632 for the collectors of the HBTs are electrically coupled to each other via the seed bodies 612 and the impurity region 604 so that the two HBTs are connected in parallel. The impurity region 604 can serve as the electrode for a collector or can be used as an extension section of the electrode for a collector. By coupling the two HBTs via the impurity region 604, it is not necessary to form a collector mesa, a collector electrode, and a wire for each HBT. Moreover, freedom of structural design for the electronic device 600 can be increase. Furthermore, the production process of the electronic device 600 can be simplified.

The base wafer 602 corresponds to the base wafer 202 shown in FIG. 2. The impurity region 604 corresponds to the impurity region 204. The inhibitor 606 corresponds to the inhibitor 206. The seed body 612 corresponds to the seed body 212. Therefore, explanations for the same structures or features in the semiconductor wafer 200 will be hereunder omitted.

The semiconductor 632 for a collector is, for example, a compound semiconductor. The semiconductor 632 for a collector corresponds to the compound semiconductor 214 shown in FIG. 2. The semiconductor 632 for a collector is, for example, an N-type or P-type compound semiconductor. The semiconductor 632 for a collector is a compound semiconductor that is appropriate for a collector of an HBT. For example, the semiconductor 632 for a collector has a resistivity lower than the resistivities of other semiconductors in the electronic device 600.

The semiconductor 634 for a base is, for example, a compound semiconductor. The semiconductor 634 for a base corresponds to the compound semiconductor 214 shown in FIG. 2. The semiconductor 634 for a base is a compound semiconductor that has an opposite conductivity type to that of the semiconductor 632 for a collector. The semiconductor 634 for a base is a compound semiconductor that is appropriate for the base of the HBT.

The semiconductor 636 for an emitter is, for example, a compound semiconductor. The semiconductor 636 for an emitter corresponds to the compound semiconductor 214 shown in FIG. 2. The semiconductor 636 for an emitter is a compound semiconductor that has the same conductivity type as the semiconductor 632 for a collector. The 636 for an emitter is a compound semiconductor that is appropriate for the emitter of the HBT.

The semiconductor 632 for a collector, the semiconductor 634 for a base, and the semiconductor 636 for an emitter are formed in the stated order on the seed body 612. The semiconductor 632 for a collector, the semiconductor 634 for a base, and the semiconductor 636 for an emitter are lattice-matched or pseudo-lattice-matched to the seed body 612.

The semiconductor 632 for a collector, the semiconductor 634 for a base, and the semiconductor 636 for an emitter are, for example, a Group 4 compound semiconductor, a Group 3-5 compound semiconductor or a Group 2-6 compound semiconductor. An example of the Group 3-5 compound semiconductor includes GaP, GaAs, GaAsP, InGaAs, AlGaAs, InGaP, InGaAsP, AlInGaP, GaN, InGaN and InP. The semiconductor 632 for a collector, the semiconductor 634 for a base, and the semiconductor 636 for an emitter form a NPN junction or a PNP junction, and an HBT is formed in the electronic device 600.

The semiconductor 632 for a collector, the semiconductor 634 for a base, and the semiconductor 636 for an emitter form a stacked structure that includes multiple semiconductor layers having, for example, different composition, doping concentrations and film thicknesses. The electronic device 600 can further include a stacked structure that has a finite thickness and includes layers with different compositions, doping concentrations and film thicknesses. The electronic device 600 can have such stacked structure between the semiconductor 632 for a collector and the seed body 612, between the semiconductor 632 for a collector and the semiconductor 634 for a base, between the semiconductor 634 for a base and the semiconductor 636 for an emitter, between the semiconductor 636 for an emitter and the emitter electrode 646, or between the semiconductor 634 for a base and the base electrode 644.

For example, the electronic device 600 further has a semiconductor for a sub-collector between the semiconductor 632 for a collector and the seed body 612. The electronic device 600 can further have a semiconductor for a sub-emitter between the semiconductor 636 for an emitter and the emitter electrode 646.

The base electrode 644 is formed so as to be in contact with the semiconductor 634 for a base, and connects the semiconductor 634 for a base with an external circuit. The base electrode 644 is formed of an electrically conductive material. A material for the base electrode 644 is, for example, metal. AuZn, CrAu, Ti/Pt, Ti/Pt/Au or the like can be used as the material for the base electrode 644. The base electrode 644 can be formed by a sputtering method, a vacuum deposition method or the like.

The emitter electrode 646 is formed so as to be in contact with the semiconductor 636 for an emitter, and connects the semiconductor 636 for an emitter to an external circuit. The emitter electrode 646 is formed of an electrically conductive material. A material for the emitter electrode 646 is, for example, metal. For example, AuGe/Ni/Au, Ti/Pt, Ti/Pt/Au can be used as the material for the emitter electrode 646. The emitter electrode 646 can be formed by a sputtering method, a vacuum deposition method or the like.

Figure 7:
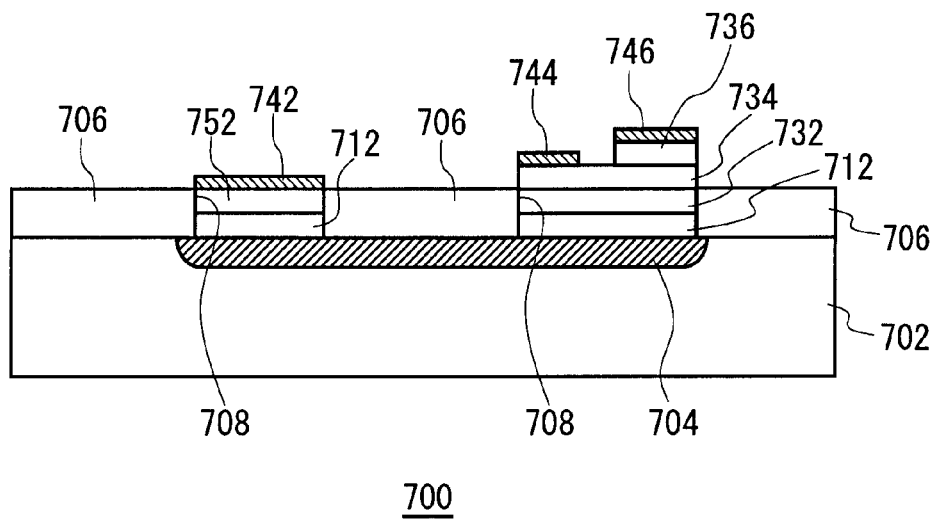
FIG. 7 illustrates an example of a cross section of an electronic device 700.

FIG. 7 illustrates an example of a cross section of an electronic device 700. The electronic device 700 includes a base wafer 702, an inhibitor 706, a seed body 712, a semiconductor 732 for a collector, a semiconductor 734 for a base, a semiconductor 736 for an emitter, a collector electrode 742, a base electrode 744, an emitter electrode 746, and a semiconductor 752 for a collector contact. The base wafer 702 has an impurity region 704.

The electronic device 700 has one HBT. The HBT is an example of the compound semiconductor element. The semiconductor 732 for the collector of the HBT is electrically coupled to the impurity region 704 via the seed body 712. In the electronic device 700, the collector electrode 742 is disposed on the semiconductor 752 for a collector contact which is separated from the semiconductor 732 for a collector. The collector electrode 742 and the semiconductor 732 for a collector are coupled each other via the seed body 712 and the impurity region 704.

The base wafer 702 corresponds to the base wafer 602 shown in FIG. 6. The impurity region 704 corresponds to the impurity region 604. The inhibitor 706 corresponds to the inhibitor 606. The seed body 712 corresponds to the seed body 612.

The semiconductor 732 for a collector, the semiconductor 734 for a base, and the semiconductor 736 for an emitter correspond to the semiconductor 632 for a collector, the semiconductor 634 for a base, and the semiconductor 636 for an emitter shown in FIG. 6 respectively. The base electrode 744 and the emitter electrode 746 correspond to the base electrode 644 and the emitter electrode 646 respectively. Explanations for the features or structures that are the same as those of the electronic device 600 will be hereunder omitted.

The semiconductor 752 for a collector contact is, for example, a compound semiconductor. The semiconductor 752 for a collector contact forms, for example, an ohmic contact with a metal electrode that is formed in contact with the semiconductor 752 for a collector contact. The semiconductor 752 for a collector contact is formed on the seed body 712 by, for example, an epitaxial growth method. The semiconductor 752 for a collector contact can be electrically coupled to the semiconductor 732 for a collector via the seed body 712 and the impurity region 704.

The semiconductor 752 for a collector contact is a Group 4 compound semiconductor, a Group 3-5 compound semiconductor or a Group 2-6 compound semiconductor. An example of a material for forming the semiconductor 752 for a collector contact includes GaAs, InGaAs, AlGaAs and InGaP. The semiconductor 752 for a collector contact contains, for example, an impurity atom that has the same conductivity type as the impurity atom contained in the semiconductor 732 for a collector. The semiconductor 752 for a collector contact contains the impurity atoms at a concentration higher than the concentration in, for example, the semiconductor 732 for a collector.

The collector electrode 742 is formed to be in contact with, for example, the semiconductor 752 for a collector contact. The collector electrode 742 is electrically coupled to the semiconductor 732 for a collector via the semiconductor 752 for a collector contact, the seed body 712 and the impurity region 704. The collector electrode 742 connects the semiconductor 732 for a collector to an external circuit. The collector electrode 742 is formed of an electrically conductive material. A material for the collector electrode 742 is, for example, metal. AuGe/Ni/Au can be used as the material for the collector electrode 742. The collector electrode 742 can be formed by a sputtering method, a vacuum deposition method or the like.

In the electronic device 700, since the collector electrode 742 is electrically coupled to the semiconductor 732 for a collector via the impurity region 704, it is not necessary for the electronic device 700 to have a collector mesa. Accordingly, it is possible to secure the area at the peak of the emitter mesa as large as that of the case in which the base wafer 702 does not have the impurity region 704, and to reduce the size of the aperture 708 in the inhibitor 706 at the same time. Consequently, it is possible to reduce an area on which selective epitaxial is performed. By reducing the selective epitaxial area, it is possible to reduce the lattice defects such as dislocation generated inside the seed body 712 due to the difference in the lattice constant between the base wafer 702 and the seed body 712, and therefore the crystallinity of the seed body 712 can be improved.

Moreover, the collector is formed inside the aperture 708 in the inhibitor 706 so that unevenness caused by a difference in height between the HBT and the inhibitor 706 or the base wafer 702 can be reduced. By reducing the height difference, it is possible to facilitate planarization performed in the subsequent process. Thus, the above described structure of the electronic device 700 is adequate for microfabrication in production processes of semiconductor devices such as silicon processes which require planarization.

Figure 8:
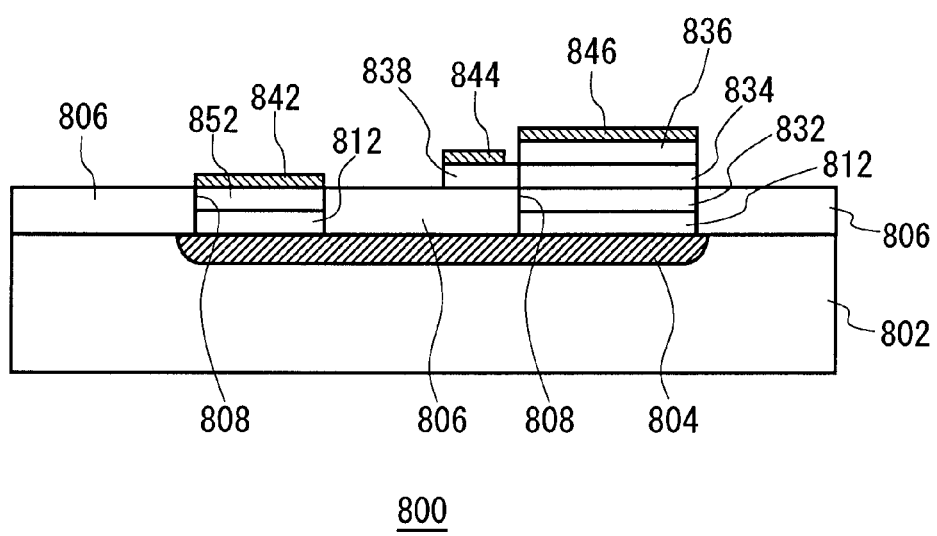
FIG. 8 illustrates an example of a cross section of an electronic device 800.

FIG. 8 illustrates an example of a cross section of an electronic device 800. The electronic device 800 includes a base wafer 802, an inhibitor 806, a seed body 812, and a semiconductor 832 for a collector, a semiconductor 834 for a base, a semiconductor 836 for an emitter, a base mesa 838, a collector electrode 842, a base electrode 844, an emitter electrode 846, and a semiconductor 852 for a collector contact. The base wafer 802 has an impurity region 804. The electronic device 800 includes one HBT. The HBT is an example of the compound semiconductor element. The electronic device 800 has the base mesa 838 which is laterally grown on the inhibitor 806 in contact with the side face of the semiconductor 834 for a base. This feature is different from the electronic device 700.

The base wafer 802 corresponds to the base wafer 702 shown in FIG. 7. The impurity region 804 corresponds to the impurity region 704. The inhibitor 806 corresponds to the inhibitor 706. The seed body 812 corresponds to the seed body 712. The semiconductor 852 for a collector contact corresponds to the semiconductor 752 for a collector contact.

The semiconductor 832 for a collector, the semiconductor 834 for a base, and the semiconductor 836 for an emitter correspond to the semiconductor 732 for a collector, the semiconductor 734 for a base, and the semiconductor 736 for an emitter shown in FIG. 7 respectively. The collector electrode 842 and the emitter electrode 846 correspond to the collector electrode 742 and the emitter electrode 746 respectively. Explanations for the features or structures that are the same as those of the electronic device 700 will be hereunder omitted.

The base mesa 838 is a compound semiconductor that has the same composition as the semiconductor 834 for a base. The base mesa 838 contains, for example, an impurity atom that has the same conductivity type as the impurity atom contained in the semiconductor 834 for a base. The base mesa 838 can contain the impurity atoms at a concentration higher than the concentration in the semiconductor 834 for a base. The base mesa 838 can be single-crystalline or polycrystalline. The base mesa 838 is formed, for example, on the inhibitor 806 so as to be in contact with the side face of the semiconductor 834 for a base. The base mesa 838 can be formed by a CVD method, a MOCVD method or the like.

The base electrode 844 is formed so as to be in contact with the base mesa 838. The base electrode 844 connects the semiconductor 834 for a base to an external circuit via the base mesa 838. The base electrode 844 is formed of an electrically conductive material. A material for the base electrode 844 is, for example, metal. For example, AuZn, CrAu, Ti/Pt, Ti/Pt/Au can be used as the material for the base electrode 844. The base electrode 844 can be formed by a sputtering method, a vacuum deposition method or the like.

Since the electronic device 800 has the base mesa 838 that is formed on the inhibitor 806 in contact with the side face of the semiconductor 834 for a base, the emitter mesa which is formed in the electronic device 700 is no longer needed. As a result, the electronic device 800 can secure a larger area for the emitter electrode compared to the electronic device 700. Referring to FIG. 8, it is possible to realize a uniform electric field distribution in an HBT by securing the semiconductor 836 for an emitter having a large area, and thereby it is possible to enhance the breakdown voltage of the HBT.

Moreover, it is possible for the electronic device 800 to reduce the area of the selective epitaxial region by reducing the size of the aperture 808 in the inhibitor 806 while the electronic device 800 has the semiconductor 836 for an emitter with the same size of that in the electronic device 700. By reducing the selective epitaxial area, it is possible to reduce the lattice defects such as dislocation generated inside the seed body 812 due to the difference in the lattice constant between the base wafer 802 and the seed body 812, and therefore the crystallinity of the seed body 812 can be improved.

Moreover, in the electronic device 800, the collector is formed inside the aperture 808 in the inhibitor 806 so that unevenness caused by a difference in height between the HBT and the inhibitor 806 or the base wafer 802 can be reduced, and therefore planarization in the subsequent device process can be facilitated. Thus, the electronic device 800 is adequate for microfabrication in production processes of semiconductor devices such as silicon processes which require planarization.

Figure 9:
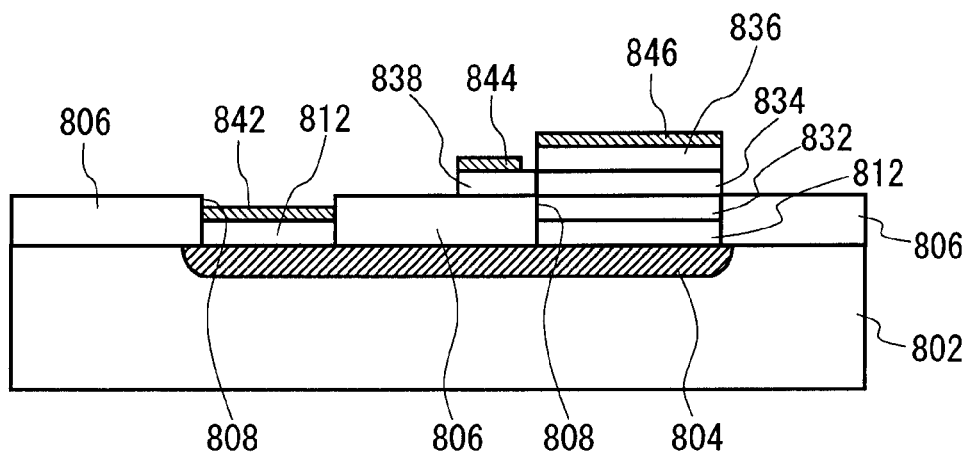
FIG. 9 illustrates an example of a cross section of an electronic device 900.

FIG. 9 illustrates an example of a cross section of an electronic device 900. The electronic device 900 includes the base wafer 802 that has the impurity region 804, the inhibitor 806, the seed body 812, the semiconductor 832 for a collector, the semiconductor 834 for a base, the semiconductor 836 for an emitter, the base mesa 838, the collector electrode 842, the base electrode 844, and the emitter electrode 846. The electronic device 900 includes one HBT. The HBT is an example of the compound semiconductor element. The structures of the electronic device 900 are same as those of the electronic device 800 except for the semiconductor 852 for a collector contact which is not provided in the electronic device 900. Therefore, the same structures and features as those of the electronic device 800 will be hereunder omitted.

Figure 10:
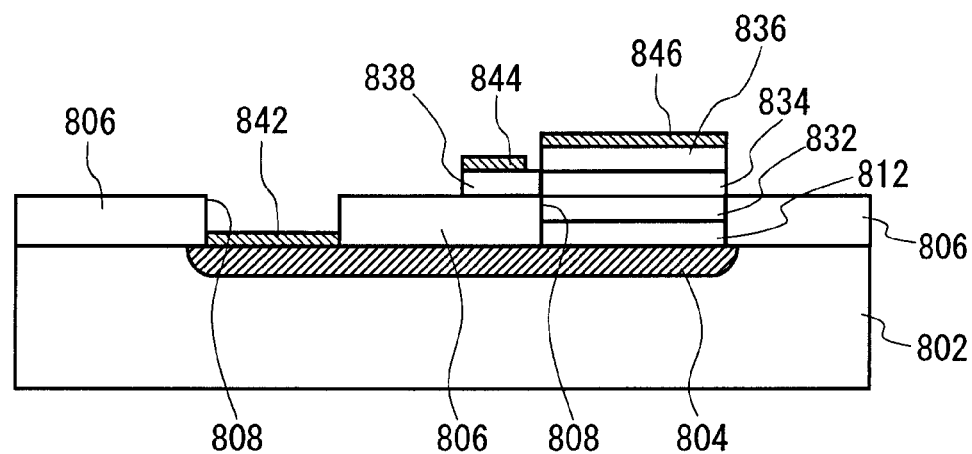
FIG. 10 illustrates an example of a cross section of an electronic device 1000.

FIG. 10 illustrates an example of a cross section of an electronic device 1000. The electronic device 1000 includes the base wafer 802, the impurity region 804, the inhibitor 806, the seed body 812, the semiconductor 832 for a collector, the semiconductor 834 for a base, the semiconductor 836 for an emitter, the base mesa 838, the collector electrode 842, the base electrode 844, and the emitter electrode 846. The electronic device 1000 includes one HBT. The HBT is an example of the compound semiconductor element. The structures of the electronic device 1000 are same as those of the electronic device 800 except for the semiconductor 852 for a collector contact which is not provided in the electronic device 1000, and the collector electrode 842 that is formed directly on the impurity region 804 without the seed body 812 interposed therebetween. Therefore, the same structures and features as those of the electronic device 800 will be hereunder omitted.

The electronic device 900 and the electronic device 1000 can reduce a contact resistance of the collector electrode 842 compared to the electronic device 800 because of the structural difference from the electronic device 800. The electronic device 900 and the electronic device 1000 can have a structure in which the emitter electrode and the base electrode are formed on the emitter mesa just like the electronic device 700 shown in FIG. 7.

Figure 11:
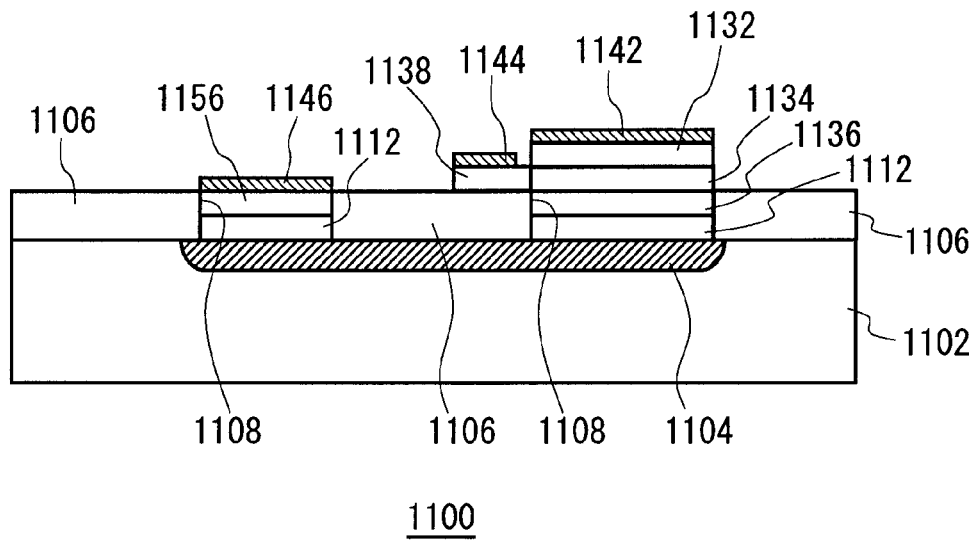
FIG. 11 illustrates an example of a cross section of an electronic device 1100.

FIG. 11 illustrates an example of a cross section of an electronic device 1100. The electronic device 1100 includes a base wafer 1102 that has an impurity region 1104, an inhibitor 1106, a seed body 1112, a semiconductor 1132 for a collector, a semiconductor 1134 for a base, a semiconductor 1136 for an emitter, a base mesa 1138, a collector electrode 1142, a base electrode 1144, an emitter electrode 1146, and a semiconductor 1156 for an emitter contact.

The electronic device 1100 includes one HBT. The HBT is an example of the compound semiconductor element. The semiconductor 1136 for the emitter of the HBT is electrically coupled to the impurity region 1104 via the seed body 1112. The electronic device 1100 has the emitter electrode 1146 which is provided on the semiconductor 1156 for an emitter contact that is separated from the semiconductor 1136 for an emitter. The emitter electrode 1146 and the semiconductor 1136 for an emitter are electrically coupled each other via the seed body 1112 and the impurity region 1104.

The base wafer 1102 corresponds to the base wafer 802 shown in FIG. 8. The impurity region 1104 corresponds to the impurity region 804. The inhibitor 1106 corresponds to the inhibitor 806. The seed body 1112 corresponds to the seed body 812. The base mesa 1138 corresponds to the base mesa 838. The base electrode 844 corresponds to the base electrode 844. Therefore, the same structures and features as those of the electronic device 800 will be hereunder omitted.

The semiconductor 1136 for an emitter, the semiconductor 1134 for a base, and the semiconductor 1132 for a collector correspond to the semiconductor 836 for an emitter, the semiconductor 834 for a base, and the semiconductor 832 for a collector shown in FIG. 8 respectively. The semiconductor 1136 for an emitter, the semiconductor 1134 for a base, and the semiconductor 1132 for a collector can be formed on the seed body 1112 in the stated order.

The collector electrode 1142 is formed, for example, so as to be in contact with the semiconductor 1132 for a collector. The collector electrode 1142 connects the semiconductor 1132 for a collector to an external circuit. The collector electrode 1142 is formed of for example, an electrically conductive material. A material for the collector electrode 1142 is, for example, metal. An example of the material for the collector electrode 1142 includes AuGe/Ni/Au. The collector electrode 1142 can be formed by a sputtering method, a vacuum deposition method or the like.

The semiconductor 1156 for an emitter contact is an example of the compound semiconductor. The semiconductor 1156 for an emitter contact forms, for example, an ohmic contact with a metal electrode that is formed in contact therewith. The semiconductor 1156 for an emitter contact is formed on the seed body 1112 by, for example, an epitaxial growth method. The semiconductor 1156 for an emitter contact can be electrically coupled to the semiconductor 1136 for an emitter via the seed body 1112, and the impurity region 1104.

The semiconductor 1156 for an emitter contact is a Group 4 compound semiconductor, a Group 3-5 compound semiconductor or a Group 2-6 compound semiconductor. An example of a material for forming the semiconductor 1156 for an emitter contact includes GaAs and InGaAs. The semiconductor 1156 for an emitter contact contains, for example, an impurity atom that has the same conductivity type as the impurity atom contained in the semiconductor 1136 for an emitter. The semiconductor 1156 for an emitter contact contains the impurity atoms at a concentration higher than the concentration in, for example, the semiconductor 1136 for an emitter.

The emitter electrode 1146 is formed so as to be in contact with, for example, the semiconductor 1156 for an emitter contact. The emitter electrode 1146 can be electrically coupled to the semiconductor 1136 for an emitter via the semiconductor 1156 for an emitter contact, the seed body 1112, and the impurity region 1104. The emitter electrode 1146 connects the semiconductor 1136 for an emitter to an external circuit. The emitter electrode 1146 is formed of an electrically conductive material. A material for the emitter electrode 1146 is, for example, metal. AuGe/Ni/Au can be used as the material for the emitter electrode 1146. The emitter electrode 1146 can be formed by a sputtering method, a vacuum deposition method or the like.

Since the electronic device 1100 has the structure shown in FIG. 11, it is not necessary to form a collector mesa and an emitter mesa, it is possible to secure a larger area for the emitter electrode compared to the electronic device 800. Therefore it is possible to realize a uniform electric field distribution in an HBT by securing a large area of an emitter electrode, and thereby it is possible to enhance the breakdown voltage of the HBT.

Moreover, the electronic device 1100 has the smaller aperture 1108 compared to the aperture 808 in the electronic device 800 while the electronic device 1100 has the semiconductor 1136 for an emitter with the same size of that in the electronic device 800. Therefore, the electronic device 1100 has a smaller selective epitaxial region than that of the electronic device 800. Since the selective epitaxial region is small in the electronic device 1100, it is possible to reduce the lattice defects such as dislocation generated inside the seed body 1112 due to the difference in the lattice constant between the base wafer 1102 and the seed body 1112, and therefore the crystallinity of the seed body 1112 can be improved.

In the structure illustrated by FIG. 11, an emitter can be formed inside the aperture 1108 in the inhibitor 1106. Consequently, unevenness caused by a difference in height between the HBT and the inhibitor 1106 or the base wafer 1102 can be reduced, and it facilitates planarization performed in the subsequent device process. Thus, the electronic device 1100 is adequate for microfabrication in production processes of semiconductor devices such as silicon processes which require planarization.

In the structure illustrated in FIG. 11, the seed body 1112 and the impurity region 1104 serve as emitter ballast. More specifically, it is possible to suppress thermal runaway because the electronic device shown in FIG. 11 has a heat dissipation effect larger than those in the structures of the electronic devices illustrated in FIGS. 7 to 10. Moreover, when the emitter is grounded, a collector signal which is an output signal can be separated from the wafer so that it is possible to reduce noise generated due to the collector signal.

Figure 12:
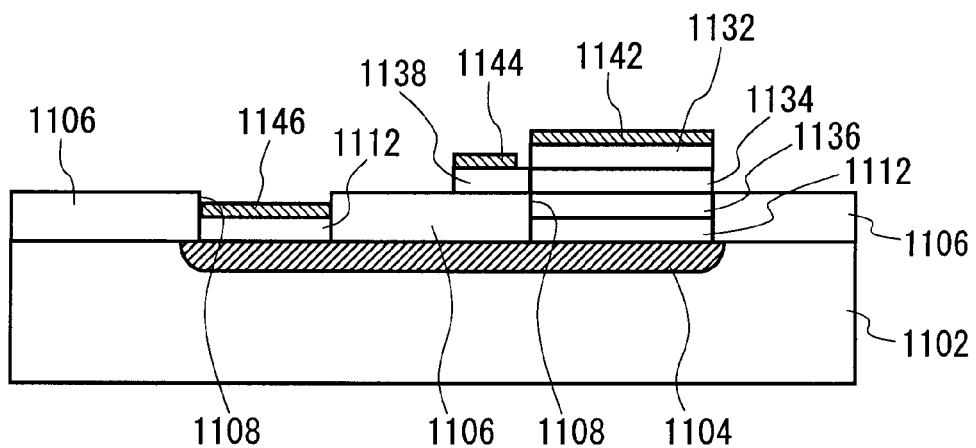
FIG. 12 illustrates an example of a cross section of an electronic device 1200.

FIG. 12 illustrates an example of a cross section of an electronic device 1200. The electronic device 1200 includes the base wafer 1102 that has the impurity region 1104, the inhibitor 1106, the seed body 1112, the semiconductor 1132 for a collector, the semiconductor 1134 for a base, the semiconductor 1136 for an emitter, the base mesa 1138, the collector electrode 1142, the base electrode 1144, and the emitter electrode 1146. The electronic device 1200 includes one HBT. The HBT is an example of the compound semiconductor element. The structures of the electronic device 1200 are same as those of the electronic device 1100 except that the semiconductor 1156 for an emitter contact is not provided in the electronic device 1200. Therefore, the same structures and features as those of the electronic device 1100 will be hereunder omitted.

Figure 13:
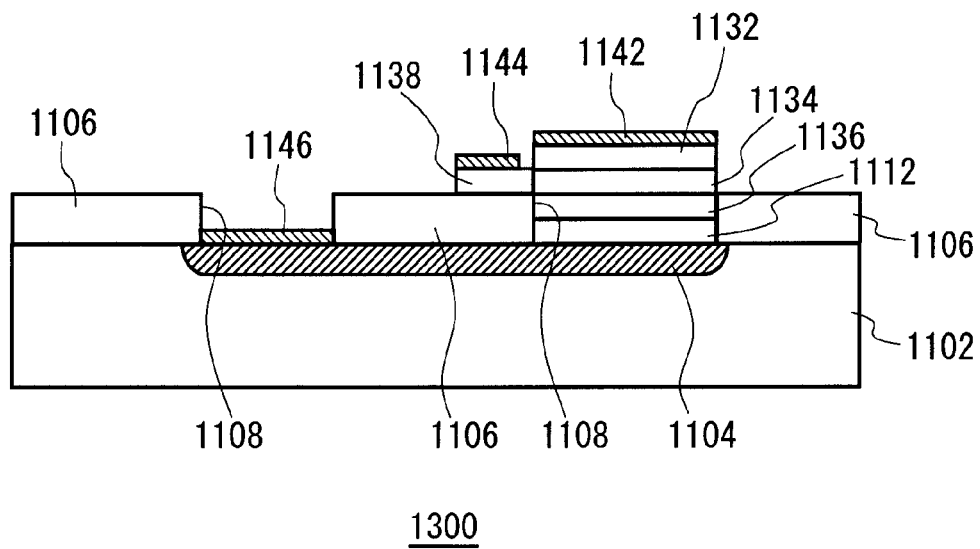
FIG. 13 illustrates an example of a cross section of an electronic device 1300.

FIG. 13 illustrates an example of a cross section of an electronic device 1300. The electronic device 1300 includes the base wafer 1102 that has the impurity region 1104, the inhibitor 1106, the seed body 1112, the semiconductor 1132 for a collector, the semiconductor 1134 for a base, the semiconductor 1136 for an emitter, the base mesa 1138, the collector electrode 1142, the base electrode 1144, and the emitter electrode 1146. The electronic device 1300 includes one HBT. The HBT is an example of the compound semiconductor element. The structures of the electronic device 1300 are same as those of the electronic device 1100 except that the semiconductor 1156 for an emitter contact is not provided in the electronic device 1300 and the emitter electrode 1146 is formed directly on the impurity region 1104 without the seed body 1112 interposed therebetween. Therefore, the same structures and features as those of the electronic device 1100 will be hereunder omitted.

Because the electronic device 1200 and the electronic device 1300 has the emitter electrode 1146 that is formed directly on the impurity region 1104 without the seed body 1112 interposed therebetween, a contact resistance of the emitter electrode 1146 is smaller than that of the electronic device 1100.

FIGS. 14 to 18 illustrate a typical production process of the electronic device 800 among the electronic devices described above. A method of producing the electronic device 800 will be hereunder described with reference to the drawings. The method of producing the electronic device 800 includes providing the semiconductor wafer described above with reference to FIGS. 3 to 5, and forming an HBT of which a collector is electrically coupled to the impurity region 804 via the seed body 812.

Figure 14:
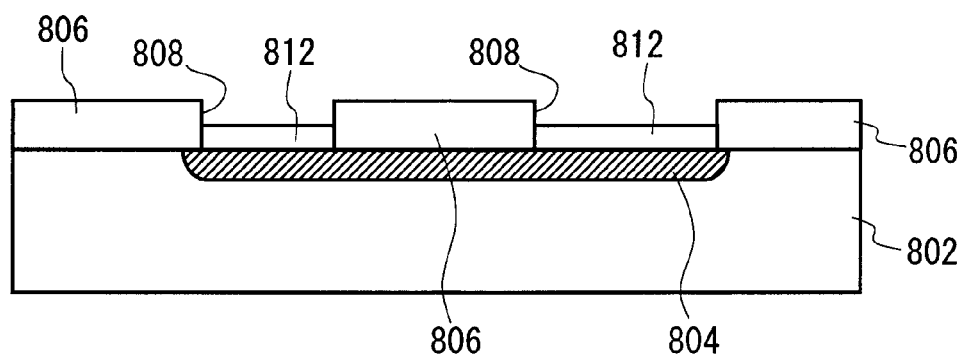
FIG. 14 illustrates a cross section example of the electronic device 800 during a production process.

FIG. 14 illustrates a semiconductor wafer which is obtained by forming the impurity region 804 by performing ion implantation on the base wafer 802, forming, on the base wafer 802, the inhibitor 806 in which the aperture 808 is provided, and forming the seed body 812 in the aperture 808 so as to be in contact with the impurity region 804. For example, the impurity region 804 that has a negative conductivity type is formed by implanting P ions into the base wafer 802. The inhibitor 806 made of silicon oxide can be formed on the base wafer 802 by a thermal oxidation method. The seed body 812 that has a two-layered structure and is in contact with the impurity region 804 can be formed by epitaxially growing a GeSi crystal layer and a Ge crystal layer selectively in the aperture 808 sequentially using a CVD method. The seed body 812 can be then heated. Each process has been described above with reference to FIGS. 3 to 5 so that the explanation will for each process will be hereunder omitted.

Figure 15:
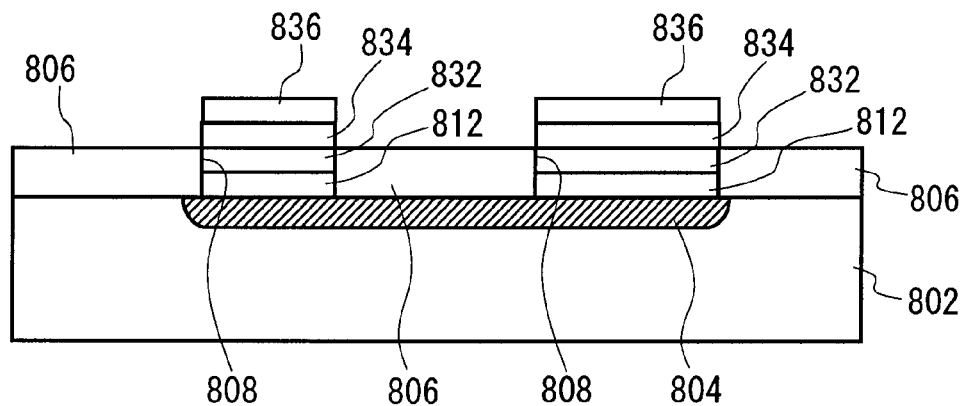
FIG. 15 illustrates another cross section example of the electronic device 800 during the production process.

Referring next to FIG. 15, the semiconductor 832 for a collector, the semiconductor 834 for a base, and the semiconductor 836 for an emitter are grown so as to be in contact with the seed body 812 by a selective epitaxial growth method. The semiconductor 832 for a collector, the semiconductor 834 for a base, and the semiconductor 836 for an emitter are lattice-matched or pseudo-lattice-matched to the seed body 812. The semiconductor 832 for a collector, the semiconductor 834 for a base, and the semiconductor 836 for an emitter are, for example, a Group 4 compound semiconductor, a Group 3-5 compound semiconductor or a Group 2-6 compound semiconductor. The semiconductor 832 for a collector made of N-type GaAs, the semiconductor for a base made of P-type GaAs, the semiconductor 836 for an emitter made of N-type InGaP are sequentially formed on the seed body 812 by, for example, a MOCVD method.

According to an example of the epitaxial growth method, after the atmosphere inside an MOCVD reactor is sufficiently replaced by high-purity hydrogen, heating of the base wafer 802 that has the seed body 812 is started. A wafer temperature at the time of crystal growth can be, for example, any temperature between 450° C. to 800° C. When the temperature of the base wafer 802 is settled to an adequate temperature, an arsenic source is introduced into the reactor, and then a gallium source or an indium source is subsequently introduced and the epitaxial growth is performed.

As the Group 3 element source, it is possible to use trimethyl gallium (TMG), trimethyl indium (TMI) or the like. As a Group 5 element source gas, it is possible to use arsine ($AsH_3$), tertiary butyl arsine (($CH_3$)$_3CAsH_2$), phosphine ($PH_3$), tertiary butyl phosphine (($CH_3$)$_3CPH_2$) or the like. Si, S, Se or Te can be added as a donor impurity atom. C, Mg or Zn can be added as an acceptor impurity atom.

Conditions for the epitaxial growth are, for example, a pressure inside the reactor of 0.1 atm, a growth temperature of 650° C. and a growth rate of 1 to 3 µm/hr. After a GaAs is deposited to around 30 nm thick under the epitaxial growth conditions of a pressure inside the reactor of 0.1 atm, a growth temperature of 550° C. and a growth rate of 0.1 to 1 µm/hr, the growth is then temporally suspended but the arsenic source atmosphere is retained and the temperature is raised to 650° C. to realize the epitaxial growth conditions of a pressure inside the reactor of 0.1 atm, a growth temperature of 650° C. and a growth rate of 0.1 to 3 µm/hr. High-purity hydrogen can be used as a carrier gas for the material.

The semiconductor 832 for a collector, the semiconductor 834 for a base, and the semiconductor 836 for an emitter each have a stacked structure that includes multiple semiconductor layers having, for example, different composition, doping concentrations and film thicknesses. The electronic device 800 can further include a stacked structure that has a finite thickness and includes semiconductor layers having different compositions, doping concentrations and film thicknesses. The electronic device 800 can have such stacked structure between the semiconductor 832 for a collector and the seed body 812, between the semiconductor 832 for a collector and the semiconductor 834 for a base, between the semiconductor 834 for a base and the semiconductor 836 for an emitter, between the semiconductor 836 for an emitter and the emitter electrode 846, or between the semiconductor 834 for a base and the base electrode 844. For example, the electronic device 800 further has a semiconductor for a sub-collector between the semiconductor 832 for a collector and the seed body 812. The electronic device 800 can further have a semiconductor for a sub-emitter between the semiconductor 836 for an emitter and the emitter electrode 846.

Figure 16:
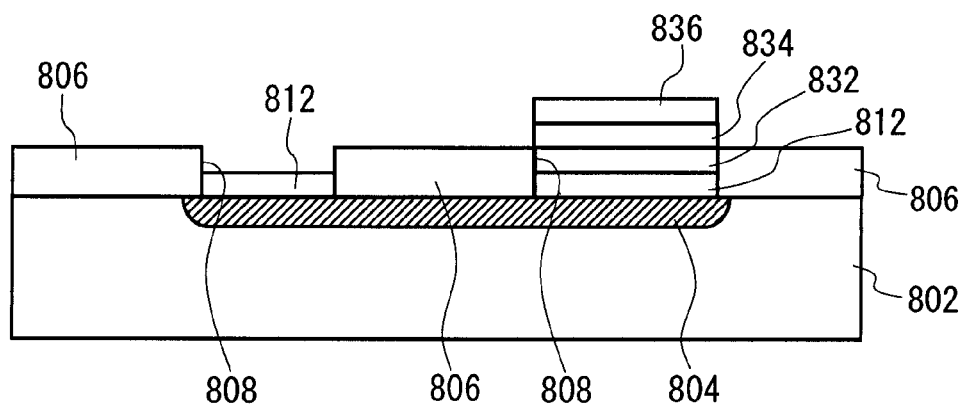
FIG. 16 illustrates another cross section example of the electronic device 800 during the production process.

When the electronic device 800 is produced, parts of the semiconductor 832 for a collector, the semiconductor 834 for a base, and the semiconductor 836 for an emitter that are situated at the position where the semiconductor 852 for a collector contact is to be formed are removed by etching to expose the seed body 812, as illustrated in FIG. 16. For example, after the resist mask that has an aperture at the position corresponding to the semiconductor for a collector contact is formed, the semiconductor 832 for a collector, the semiconductor 834 for a base, and the semiconductor 836 for an emitter are removed by etching.

Figure 17:
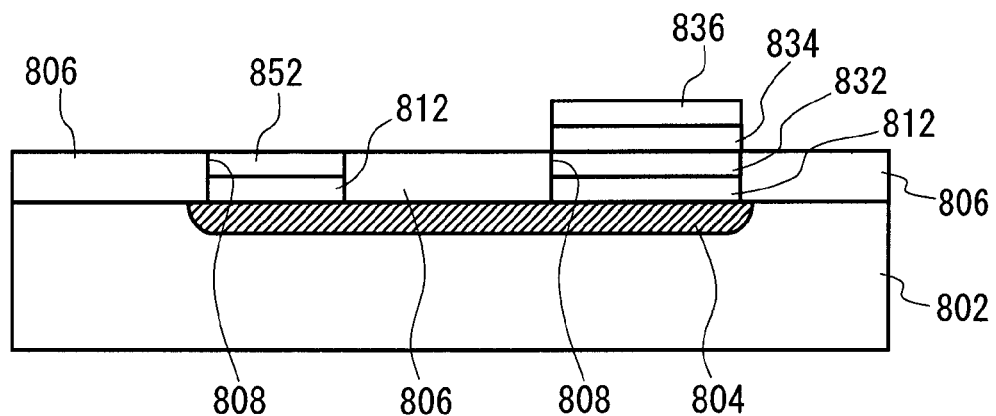
FIG. 17 illustrates another cross section example of the electronic device 800 during the production process.

Referring to FIG. 17, the semiconductor 852 for a collector contact is subsequently formed so as to be in contact with the seed body 812 exposed by the etching. For example, after the formation of an silicon oxide film that covers the semiconductor 832 for a collector, the semiconductor 834 for a base, and the semiconductor 836 for an emitter, and that has an aperture at the position where the semiconductor 852 for a collector contact is to be formed, the semiconductor 852 for a collector contact that is made of N-type GaAs in which an impurity atom is doped in a high concentration is epitaxially grown so as to be in contact with the seed body 812 by a MOCVD method. Alternatively, the semiconductor 852 for a collector contact made of GaAs can be grown and then the impurity atom can be doped by ion implantation.

Figure 18:
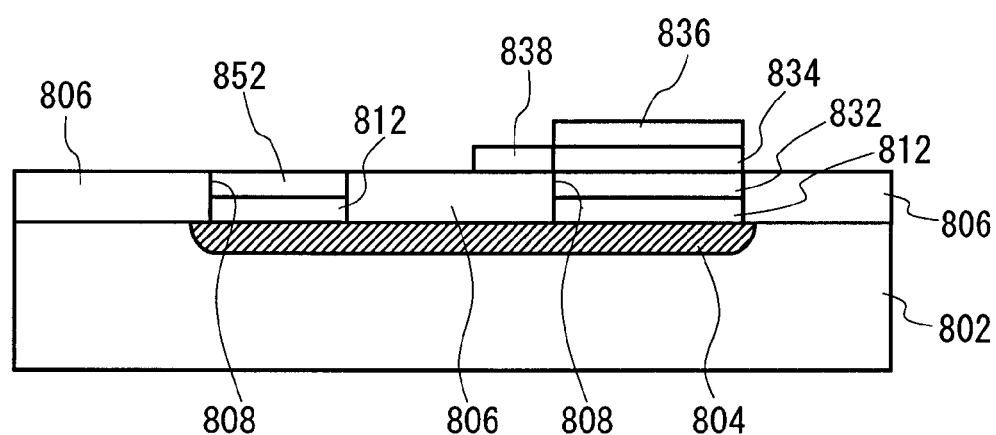
FIG. 18 illustrates another cross section example of the electronic device 800 during the production process.

Referring to FIG. 18, the base mesa 838 is subsequently formed. For example, a silicon oxide mask that has an aperture at the position where the base mesa 838 is to be formed is firstly formed, and then the base mesa 838 made of P-type GaAs is formed by a MOCVD method. The base mesa 838 contains impurity atoms at a concentration higher than the concentration in the semiconductor 834 for a base. The base mesa 838 can be formed by depositing polycrystal (non-epitaxial growth) by a CVD, MOCVD, MBE or ALD method.

For example, the base mesa 838 can be formed as the following. For instance, when the semiconductor 834 for a base is formed on the semiconductor 832 for a collector, polycrystal (including a portion that is to be the base mesa 838) is deposited (non-epitaxial growth) on the inhibitor 806 as well as the semiconductor 834 for a base is formed. After that, the base mesa 838 can be formed by a photolithography method such as etching.

Alternatively, the base mesa 838 can be formed by the following process. For instance, when the semiconductor 834 for a base is formed, the semiconductor 834 for a base is laterally grown in the horizontal direction along the surface of the inhibitor 806 by adjusting the growing conditions. The base mesa 838 can be then formed by a photolithography method such as etching.

Furthermore, as shown in FIG. 8, the electronic device 800 can be formed by further forming the emitter electrode 846, the base electrode 844, and the collector electrode 842. For example, the emitter electrode 846 can be formed by forming, on the surface of the semiconductor 836 for an emitter, a resist mask that has an aperture at the position where the emitter electrode 846 is to be formed by a photolithography method or the like, depositing metal for an electrode, and then lifting off the resist. In the same manner, the collector electrode 842 and the base electrode 844 can be formed. At this point, the electrodes which are made of the same material can be formed simultaneously.

Figure 19:
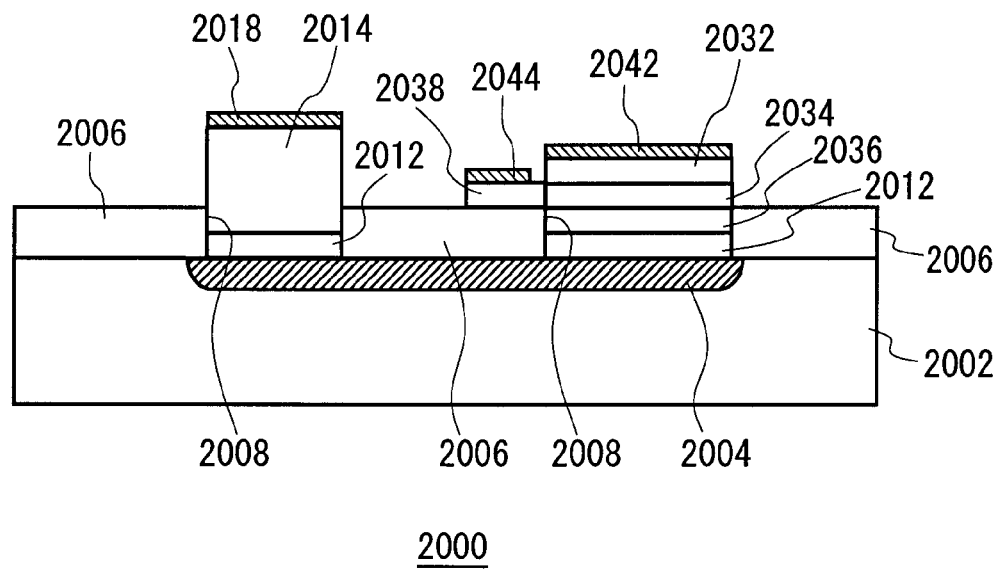
FIG. 19 illustrates an example of a cross section of an electronic device 2000.

FIG. 19 illustrates an example of a cross section of an electronic device 2000. The electronic device 2000 includes a base wafer 2002 that has an impurity region 2004, the inhibitor 2006 in which an aperture 2008 is provided, a seed body 2012, a semiconductor 2032 for a collector, a semiconductor 2034 for a base, a semiconductor 2036 for an emitter, a base mesa 2038, a collector electrode 2042, a base electrode 2044, a semiconductor 2014 for a sensor, and an electrode 2018. The electronic device 2000 includes an HBT that includes the semiconductor 2032 for a collector, the semiconductor 2034 for a base and the semiconductor 2036 for an emitter, and a sensor element that has the semiconductor 2014 for a sensor.

The base wafer 2002 corresponds to the base wafer 1102 shown in FIG. 11. The impurity region 2004 corresponds to the impurity region 1104. The inhibitor 2006 corresponds to the inhibitor 1106. The seed body 2012 corresponds to the seed body 1112. The semiconductor 2032 for a collector, the semiconductor 2034 for a base, and the semiconductor 2036 for an emitter correspond to the semiconductor 1132 for a collector, the semiconductor 1134 for a base, and the semiconductor 1136 for an emitter respectively. The base mesa 2038 corresponds to the base mesa 1138. The collector electrode 2042 and the base electrode 2044 correspond to the collector electrode 1142 and the base electrode 1144 respectively. Therefore, explanations for the structures that are the same as those of the electronic device 1100 will be hereunder omitted.

The semiconductor 2014 for a sensor is an example of the compound semiconductor. The semiconductor 2014 for a sensor is disposed so as to be in contact with the seed body 2012. The semiconductor 2014 for a sensor is lattice-matched or pseudo-lattice-matched to the seed body 2012. The semiconductor 2014 for a sensor is a Group 4 semiconductor, a Group 4 compound semiconductor, a Group 3-5 compound semiconductor or a Group 2-6 compound semiconductor. An example of the Group 3-5 compound semiconductor includes GaAs, GaN, InP and InGaAs. An example of the Group 4 semiconductor includes Ge.

The semiconductor 2014 for a sensor can be formed on the seed body 2012 with other semiconductor layer interposed therebtween. The semiconductor 2014 for a sensor has, for example, a stacked structure that includes multiple semiconductor layers having, for example, different composition, doping concentrations and film thicknesses. The semiconductor 2014 for a sensor can include a P-type semiconductor layer and an N-type semiconductor layer and can configure a diode that has a PN junction. The semiconductor 2014 for a sensor is formed by, for example, an epitaxial growth method. An example of the epitaxial growth method includes CVD, MOCVD, MBE and ALD methods.

The electrode 2018 is an output terminal that outputs a signal from the semiconductor 2014 for a sensor. The electrode 2018 connects the semiconductor 2014 for a sensor to an external circuit. The electrode 2018 is formed, for example, such that it is in contact with the semiconductor 2014 for a sensor. The electrode 2018 is formed of an electrically conductive material. A material for the electrode 2018 is, for example, metal. AuGe/Ni/Au, Ti/Pt/Au, ITO or the like can be used as the material for the electrode 2018. The electrode 2018 can be formed by a sputtering method, a vacuum deposition method or the like.

The semiconductor 2014 for a sensor and the electrode 2018 form a sensor element. Here, the sensor element means a sensor which is capable of sensing any one of light, electromagnetic wave, magnetism and so forth. For example, the sensor element is a photodiode that has a light-receiving section in the semiconductor 2014 for a sensor. The electrode 2018 can be an output terminal for the sensor element, and the lower section of the semiconductor 2014 for a sensor can be a common terminal for the sensor element. The common terminal of the sensor element is, for example, electrically coupled to the impurity region 2004 via the seed body 2012.

The semiconductor 2036 for an emitter can be electrically coupled to the common terminal of the sensor element via the seed body 2012 and the impurity region 2004. The HBT formed from the semiconductor 2032 for a collector, the semiconductor 2034 for a base and the semiconductor 2036 for an emitter amplifies, for example, an output signal from the electrode 2018 that is the output terminal of the sensor element.

Figure 20:
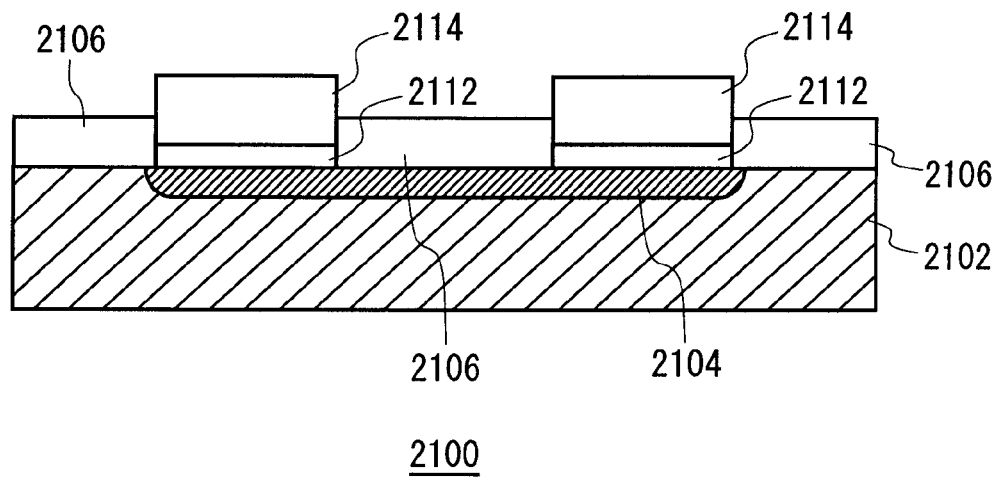
FIG. 20 illustrates an example of a cross section of a semiconductor wafer 2100.

FIG. 20 illustrates an example of a cross section of a semiconductor wafer 2100. The semiconductor wafer 2100 includes a base wafer 2102, an inhibitor 2106, a seed body 2112, and a compound semiconductor 2114.

The base wafer 2102 includes an impurity region 2104 and a first conductivity type impurity region that contains an impurity atom of a first conductivity type. For example, the first conductivity type impurity region is a region containing a moderate resistance or low resistance silicon in which a P-type or N-type impurity atom is doped. Here, "moderate resistance" means a resistance range of 1 Ω·cm or more and less than 100 Ω·cm, more preferably, a resistance range of from 1 Ω·cm to 60 Ω·cm.

The impurity region 2104 is a second conductivity type high-concentration impurity region that contains a second impurity atom having the opposite conductivity type to the first conductivity type at a higher concentration compared to the concentration of the first conductivity type impurity atom in the first conductivity type impurity region. For example, when a P-type impurity atom is doped in the silicon region, an N-type impurity atom is doped in the impurity region 2104 at a higher concentration than that in the silicon region. When an N-type impurity atom is doped in the silicon region, a P-type impurity atom is doped in the impurity region 2104 at a higher concentration than that in the silicon region.

A PN junction can be formed at the interface between the impurity region 2104 and the base wafer 2102. With this PN junction at the interface, the impurity region 2104 is electrically isolated from the base wafer 2102.

The inhibitor 2106 corresponds to the inhibitor 206 illustrated in FIG. 2. The seed body 2112 corresponds to the seed body 212. The compound semiconductor 2114 corresponds to the compound semiconductor 214. Therefore, explanations for the same structures will be hereunder omitted.

Figure 21:
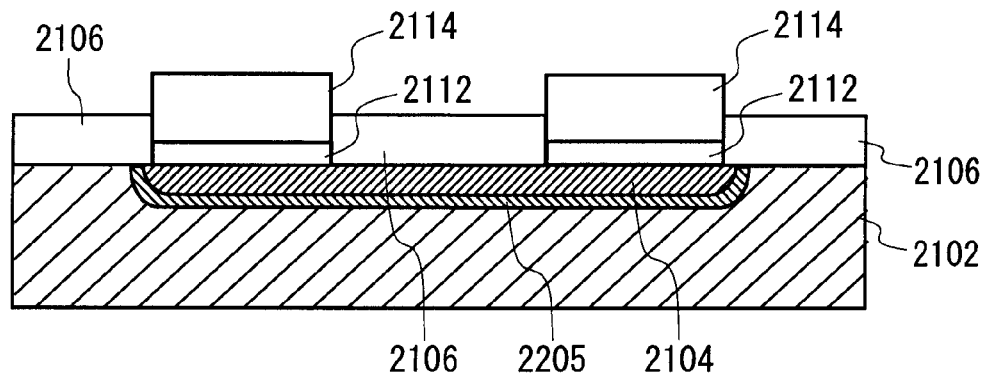
FIG. 21 illustrates an example of a cross section of a semiconductor wafer 2200.

FIG. 21 illustrates an example of a cross section of a semiconductor wafer 2200. The semiconductor wafer 2200 includes a base wafer 2102, an inhibitor 2106, a seed body 2112, and a compound semiconductor 2114. The base wafer 2102 has the impurity region 2104 and a second-conductivity type low-concentration impurity region 2205.

The semiconductor wafer 2200 is different from the semiconductor wafer 2100 shown in FIG. 20 in that it has the second conductivity type low-concentration impurity region 2205 between the impurity region 2104 and a silicon region in the base wafer 2102. The second conductivity type low-concentration impurity region 2205 contains an impurity atom at a lower concentration than the impurity region 2104. The impurity atom contained in the second-conductivity type low-concentration impurity region has the same conductivity type as that of the impurity region 2104. Since the second-conductivity type low-concentration impurity region 2205 is doped with the impurity atoms having the same conductivity type as the impurity region 2104 at a concentration lower than that of the impurity region 2104, it is possible to prevent a tunnel effect from occurring between the impurity region 2104 and the base wafer 2102.

Figure 22:
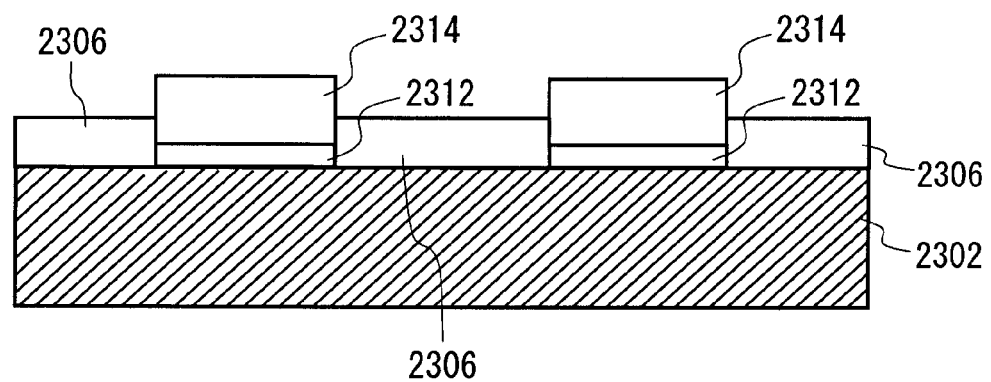
FIG. 22 illustrates an example of a cross section of a semiconductor wafer 2300.

FIG. 22 illustrates an example of a cross section of a semiconductor wafer 2300. The semiconductor wafer 2300 includes a base wafer 2302, an inhibitor 2306, a seed body 2312, and a compound semiconductor 2314. In the base wafer 2302, an impurity region is formed so as to extend from one surface to another face opposite the surface of the base wafer 2302, and the one surface is in contact with a plurality of the seed bodies 2312. For example, the base wafer 2302 is a silicon wafer in which the whole of the base wafer 2302 is doped with impurity atoms in a high concentration. The inhibitor 2306 corresponds to the inhibitor 206 illustrated in FIG. 2. The seed body 2312 corresponds to the seed body 212. The compound semiconductor 2314 corresponds to the compound semiconductor 214. Therefore, explanations for the same structures will be hereunder omitted.

Figure 23:
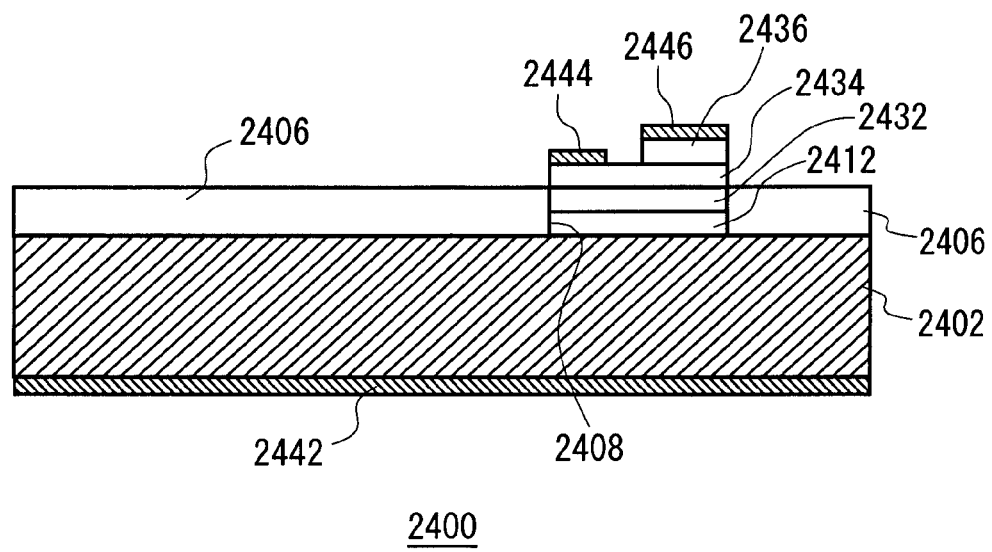
FIG. 23 illustrates an example of a cross section of an electronic device 2400.

FIG. 23 illustrates an example of a cross section of an electronic device 2400. The electronic device 2400 includes a base wafer 2402, an inhibitor 2406 in which an aperture 2408 is provided, a seed body 2412, and a semiconductor 2432 for a collector, a semiconductor 2434 for a base, a semiconductor 2436 for an emitter, a base electrode 2444 and an emitter electrode 2446. The electronic device 2400 includes one HBT. The HBT is an example of the compound semiconductor element.

The electronic device 2400 has the base wafer 2402 that is different from that in the electronic device 700 shown in FIG. 7. In the base wafer 2402, an impurity region is formed to extend from one surface to another face opposite the surface of the base wafer 2402, and the one surface is in contact with a plurality of the seed bodies 2312. The collector electrode 2442 is provided on the back side of the base wafer 2402. Since the electronic device has the above-described structure, it is not necessary to form the impurity region 702 in the production process of the electronic device 2400 whereas the production process of the electronic device 700 requires it.

Moreover, the electronic device 2400 does not have the seed body 712 and the semiconductor 752 for a collector contact that are provided for the collector electrode 742 while the electronic device 700 has these. In the electronic device 2400, an impurity region is formed so as to extend from one surface to the face opposite the surface of the base wafer 2402, and the one surface is in contact with a plurality of the seed bodies 2312. Consequently, a freedom of electrode arrangements can be increased in the designing of the electronic device 2400.

The inhibitor 2406 corresponds to the inhibitor 706 illustrated in FIG. 7. The seed body 2412 corresponds to the seed body 712. The semiconductor 2432 for a collector, the semiconductor 2434 for a base, and the semiconductor 2436 for an emitter correspond to the semiconductor 732 for a collector, the semiconductor 734 for a base, and the semiconductor 736 for an emitter shown in FIG. 7 respectively. The base electrode 2444 and the emitter electrode 2446 correspond to the base electrode 744 and the emitter electrode 746 respectively. Explanations for the structures that are the same as those of the electronic device 700 will be hereunder omitted.

Figure 24:
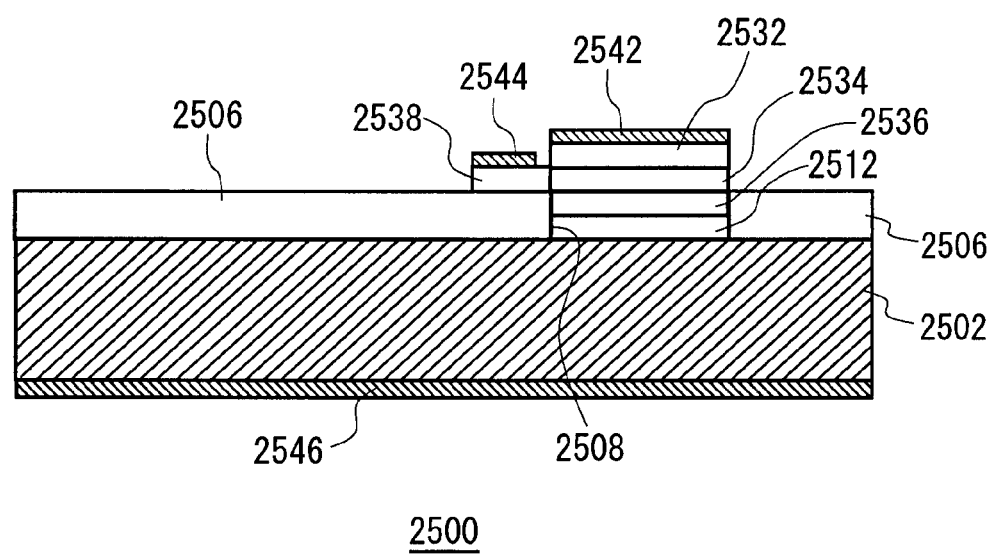
FIG. 24 illustrates an example of a cross section of an electronic device 2500.

FIG. 24 illustrates an example of a cross section of an electronic device 2500. The electronic device 2500 includes a base wafer 2502, an inhibitor 2506 in which an aperture 2508 is provided, a seed body 2512, a semiconductor 2532 for a collector, a semiconductor 2534 for a base, a semiconductor 2536 for an emitter, a base electrode 2544 and an emitter electrode 2546. The electronic device 2500 includes one HBT. The HBT is an example of the compound semiconductor element.

The electronic device 2500 has the base wafer 2502 that is different from that in the electronic device 1100 shown in FIG. 11. In the base wafer 2502, an impurity region is formed to extend from one surface to another face opposite the surface of the base wafer 2502, and the one surface is in contact with a plurality of the seed bodies 2512. In other words, the whole of the base wafer 2502 is doped with an impurity. Therefore, the resistivity of the base wafer 2502 is sufficiently low and the emitter electrode 2546 can be provided on the back side of the base wafer 2502.

When the electronic device has such structure, it is not necessary to provide the impurity region 1104 in the base wafer 2502 unlike the base wafer 1102 shown in FIG. 11. Moreover, it is not necessary to separately provide the seed body 1112 and the semiconductor 1156 for an emitter contact in order to provide the emitter electrode 1146. Accordingly, in addition to the above-described advantageous effect of the electronic device 1100, there is another advantage that the electronic device design has more choices for electrode arrangements.

The inhibitor 2506 corresponds to the inhibitor 1106 illustrated in FIG. 11. The seed body 2512 corresponds to the seed body 1112. The semiconductor 2532 for a collector, the semiconductor 2534 for a base, and the semiconductor 2536 for an emitter correspond to the semiconductor 1132 for a collector, the semiconductor 1134 for a base, and the semiconductor 1136 for an emitter respectively. The base electrode 2544 and the collector electrode 2542 correspond to the collector electrode 1142 and the base electrode 1144 respectively. The base mesa 2538 corresponds to the base mesa 1138. Therefore, explanations for the structures that are the same as those of the electronic device 1100 will be hereunder omitted.

Figure 25:
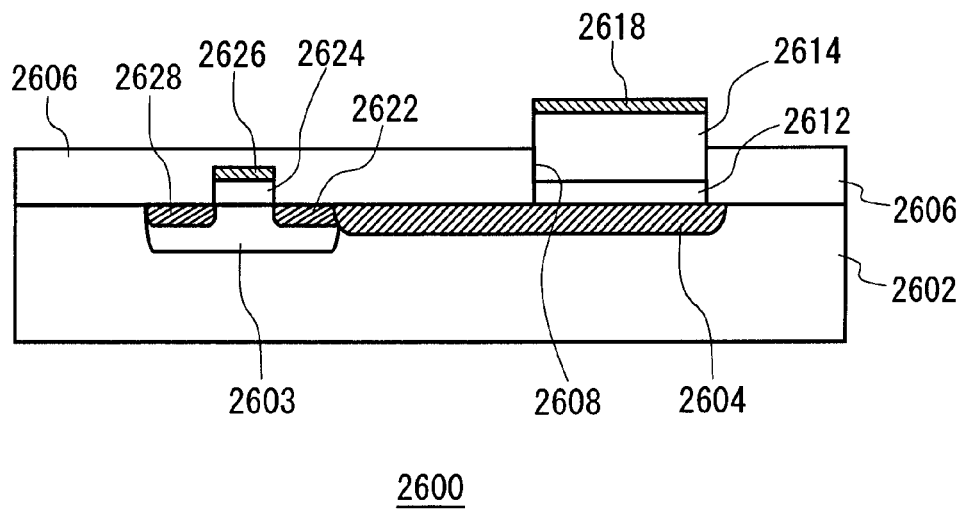
FIG. 25 illustrates an example of a cross section of an electronic device 2600.

FIG. 25 illustrates an example of a cross section of an electronic device 2600. The electronic device 2600 includes a base wafer 2602, a well 2603, an impurity region 2604, an inhibitor 2606, a seed body 2612, a compound semiconductor 2614, an electrode 2618, a source 2622, a gate insulating layer 2624, a gate electrode 2626 and a drain 2628. The electronic device 2600 includes one silicon element and one compound semiconductor element. The silicon element has an active region which is mainly made of silicon atoms. "Mainly made of silicon atoms" means that the primary component is a silicon atom but other impurity atoms can be included. Impurity atoms encompass both an impurity atom that has been purposely introduced and an impurity atom that has been involuntarily introduced.

The source 2622, the drain 2628, the gate insulating layer 2624, the gate electrode 2626 and the well 2603 together form a field effect transistor (FET) which is the silicon element. The compound semiconductor 2614 and the electrode 2618 together form the compound semiconductor element. The compound semiconductor element can be the above-described HBT, or a FET, HEMT, diode, thyristor, light-emitting element, light-receiving element or the like. For example, the compound semiconductor element can be a light emitting diode, and the FET, which is the silicon element, can be a transistor that drives the light emitting diode.

The base wafer 2602 corresponds to the base wafer 202 shown in FIG. 2. The base wafer 2602 has a silicon-element-formable region in which a silicon element having an active region mainly composed of silicon atoms can be formed. In the silicon-element-formable region, for example, the well 2603, the source 2622, the gate insulating layer 2624, the gate electrode 2626 and the drain 2628 can be formed.

The impurity region 2604 corresponds to the impurity region 204. The impurity region 2604 is in contact with the silicon-element-formable region inside the base wafer 2602. The impurity region 2604 can be extended to be in contact with the source 2622 of the FET which is the silicon element.

The inhibitor 2606 corresponds to the inhibitor 206. The seed body 2612 corresponds to the seed body 212. The compound semiconductor 2614 corresponds to the compound semiconductor 214. Therefore, explanations for the same structures or features in the semiconductor wafer 200 will be hereunder omitted.

The electrode 2618 is an output terminal that outputs a signal from the compound semiconductor 2614. The electrode 2618 connects the compound semiconductor 2614 to an external circuit. The electrode 2618 is formed to be in contact with the compound semiconductor 2614. The electrode 2618 is formed of an electrically conductive material. A material for the electrode 2618 is, for example, metal. AuGe/Ni/Au, Ti/Pt/Au, ITO or the like can be used as the material for the electrode 2618. The electrode 2618 can be formed by a sputtering method, a vacuum deposition method or the like.

Another terminal for the compound semiconductor element can be formed from a bottom edge of the compound semiconductor 2614. The bottom edge of the compound semiconductor 2614 can be electrically coupled to the impurity region 2604 via the seed body 2612. The source 2622 of the FET, which is the silicon element, and the lower edge of the compound semiconductor 2614 can be electrically coupled to each other via the seed body 2612 and the impurity region 2604.

FIGS. 26 to 30 illustrate a cross section example of the electronic device 2600 during a production process. A method of producing the electronic device 2600 will be hereunder described with reference to the drawings. The method of producing the electronic device 2600 includes forming a silicon element, forming an impurity region, forming an inhibitor, forming a seed body, forming a compound semiconductor, and forming a compound semiconductor element.

Figure 26:
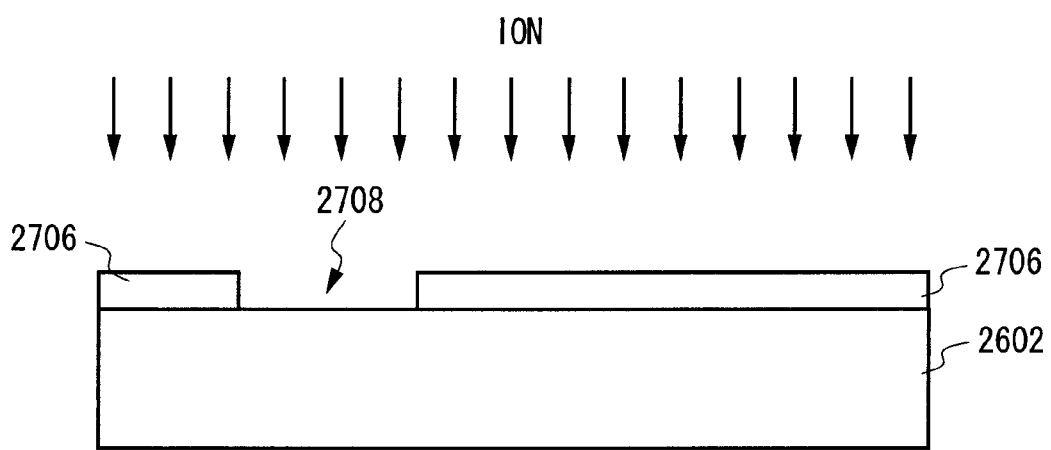
FIG. 26 illustrates a cross section example of the electronic device 2600 during a production process.

Referring to FIG. 26, when a silicon element is formed, a mask pattern 2706 is formed on the base wafer 2602, and the well 2603 is formed by ion-implantation. The mask pattern 2706 is a photoresist mask. The mask pattern 2706 is a mask made of silicon oxide, silicon nitride, or a multilayer thereof. For example, a silicon oxide film is formed on the surface of the base wafer 2602 by CVD, and then an aperture 2708 is formed in the silicon oxide film at a position where the well 2603 is to be formed by a photolithography method such as etching. In this way, the mask pattern 2706 can be completed. When an N-type well is formed, a Group 5 atom ion such as P can be implanted, whereas when a P-type well is formed, Group 3 atom ion such as B can be implanted. After the ion implantation, diffusion annealing and the like can be performed.

Figure 27:
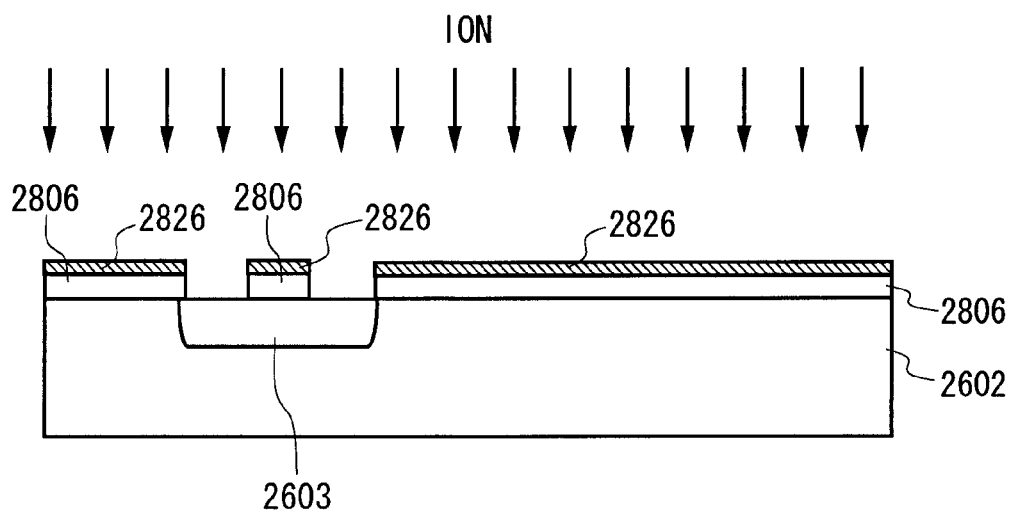
FIG. 27 illustrates another cross section example of the electronic device 2600 during the production process.

Referring now to FIG. 27, the mask pattern 2706 is removed, a silicon oxide film 2806 from which the gate insulating layer is formed is formed, and a polysilicon film 2826 from which the gate electrode is formed is formed. The silicon oxide film 2806 and the polysilicon film 2826 can be formed by a CVD method. Apertures can be formed in the silicon oxide film 2806 and the polysilicon film 2826 at positions where the source 2622 and the drain 2628 are to be formed by a photolithography method such as etching, and then ion-implantation can be performed. The source 2622 and the drain 2628 have, for example, an opposite electric-conductivity type to the well 2603. After the ion-implantation, diffusion annealing can be performed.

Figure 28:
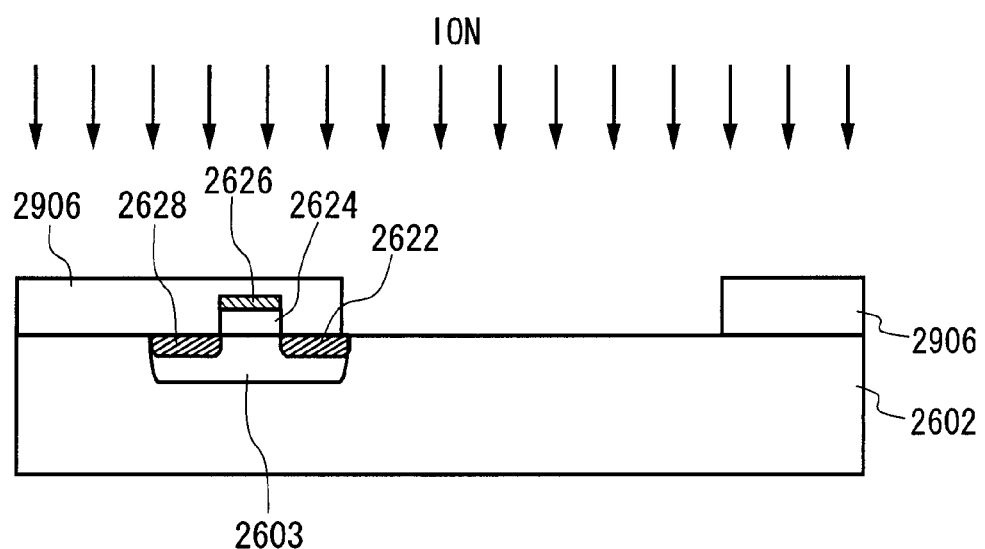
FIG. 28 illustrates another cross section example of the electronic device 2600 during the production process.

Referring now to FIG. 28, when the impurity region 2604 is formed, parts of the silicon oxide film 2806 and the polysilicon film 2826 other than the areas where the gate insulting layer and the gate electrode are to be formed are removed by a photolithography method such as etching, and the gate insulating layer 2624 and the gate electrode 2626 are then formed. Subsequently, a mask pattern 2906 is formed and the impurity region 2604 is then formed by ion-implantation. The mask pattern 2906 is a photoresist mask. The mask pattern 2906 is a mask made of silicon oxide, silicon nitride, or a multilayer thereof. The mask pattern 2906 is formed in the same manner as the mask pattern 2706. The impurity region 2604 can have the same electric conductivity type as the source 2622 and the drain 2628.

Figure 29:
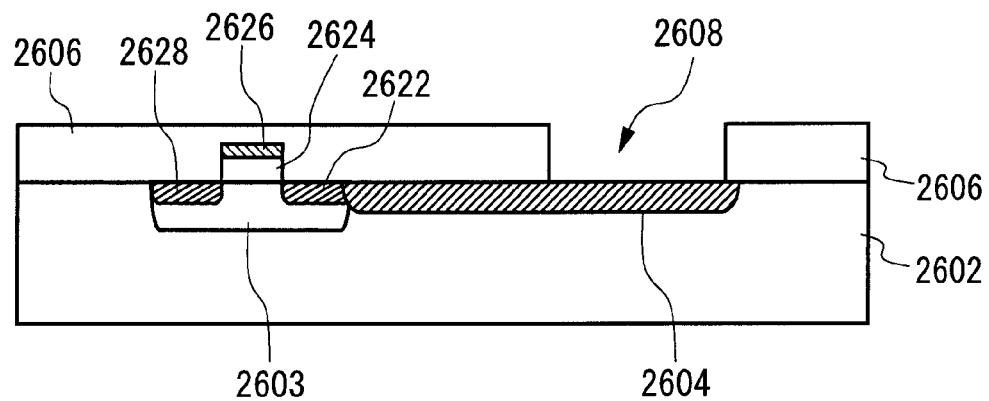
FIG. 29 illustrates another cross section example of the electronic device 2600 during the production process.

Referring to FIG. 29, when the inhibitor 2606 is formed, the inhibitor 2606 that covers the FET which is the silicon element is formed, and an aperture 2608 in which at least a part of the impurity region 2604 is exposed is formed in the inhibitor 2606. A silicon oxide film that serves as the inhibitor 2606 is formed to cover the whole surface of the base wafer 2602 by, for example, a thermal oxidation method, and the aperture 2608 that reaches to the impurity region 2604 is formed at a position where the seed body 2612 is to be formed.

Figure 30:
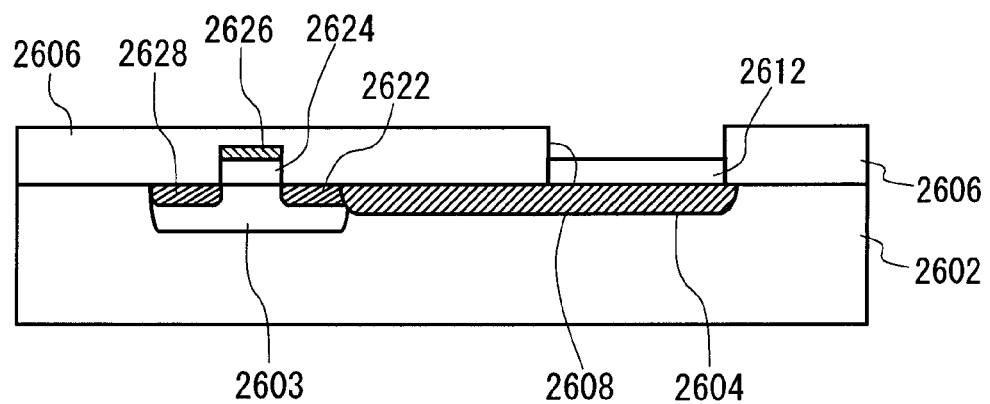
FIG. 30 illustrates another cross section example of the electronic device 2600 during the production process.

Referring now to FIG. 30, when the seed body is formed, the seed body 2612 which is composed of $C_xSi_yGe_zSn_{1-x-y-z}$ ($0 \leq x < 1$, $0 \leq y \leq 1$, $0 \leq z \leq 1$, and $0 < x+y+z \leq 1$) is formed in the aperture 2608 by a selective epitaxial growth method. An example of the epitaxial growth method includes CVD, MOCVD, MBE and ALD methods. For example, SiGe crystal is formed as the seed body 2612 by a CVD method. The epitaxial growth of the seed body 2612 is inhibited on the surface of the inhibitor 2606 so that the seed body 2612 is selectively grown in the aperture 2608 by the epitaxial growth method. Subsequently, the seed body 2612 can be heated.

When the compound semiconductor is formed, the compound semiconductor 2614 is epitaxially grown selectively on the seed body 2612 as illustrated in FIG. 25. An example of the epitaxial growth method includes CVD, MOCVD, MBE and ALD methods. The compound semiconductor 2614 can be lattice-matched or pseudo-lattice-matched to the seed body 2612. The compound semiconductor 2614 is, for example, a Group 4 compound semiconductor, a Group 3-5 compound semiconductor or a Group 2-6 compound semiconductor. The compound semiconductor 2614 is, for example, has a stacked structure that includes multiple semiconductor layers having, for example, different composition, doping concentrations and film thicknesses. For instance, the compound semiconductor 2614 is a light emitting diode that includes a P-type semiconductor and an N-type semiconductor and has a PN junction.

When the compound semiconductor element is formed, the electrode 2618 can be formed and thereby the electronic device 2600 can be formed as illustrated in FIG. 25.

Figure 31:
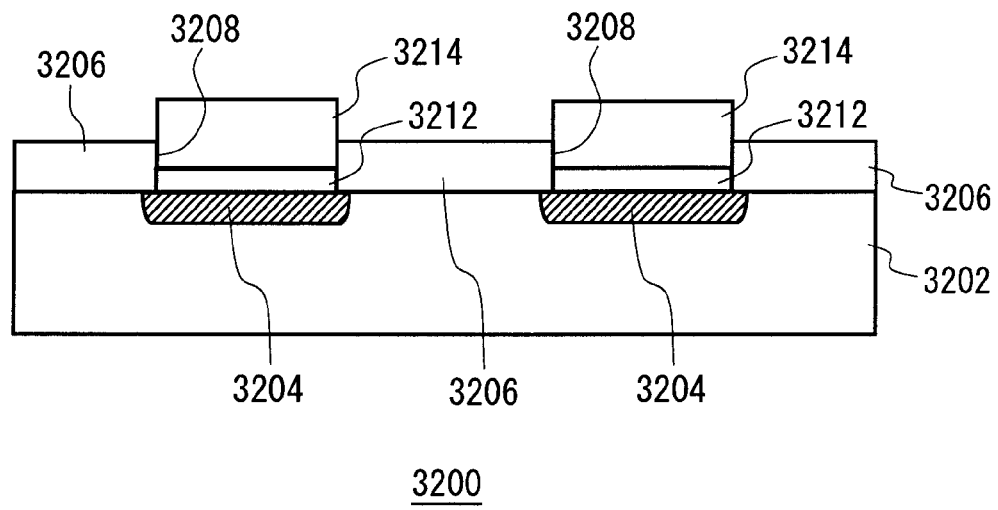
FIG. 31 illustrates an example of a cross section of a semiconductor wafer 3200.

FIG. 31 illustrates an example of a cross section of a semiconductor wafer 3200. The semiconductor wafer 3200 includes a base wafer 3202, an impurity region 3204, an inhibitor 3206 in which an aperture 3208 is formed, a seed body 3212, and a compound semiconductor 3214.

The base wafer 3202 corresponds to the base wafer 202 shown in FIG. 2. The impurity region 3204 corresponds to the impurity region 204. The inhibitor 3206 corresponds to the inhibitor 206. The seed body 3212 corresponds to the seed body 212. The compound semiconductor 3214 corresponds to the compound semiconductor 214. Therefore, explanations for the same structures or features in the semiconductor wafer 200 will be hereunder omitted.

Figure 32:
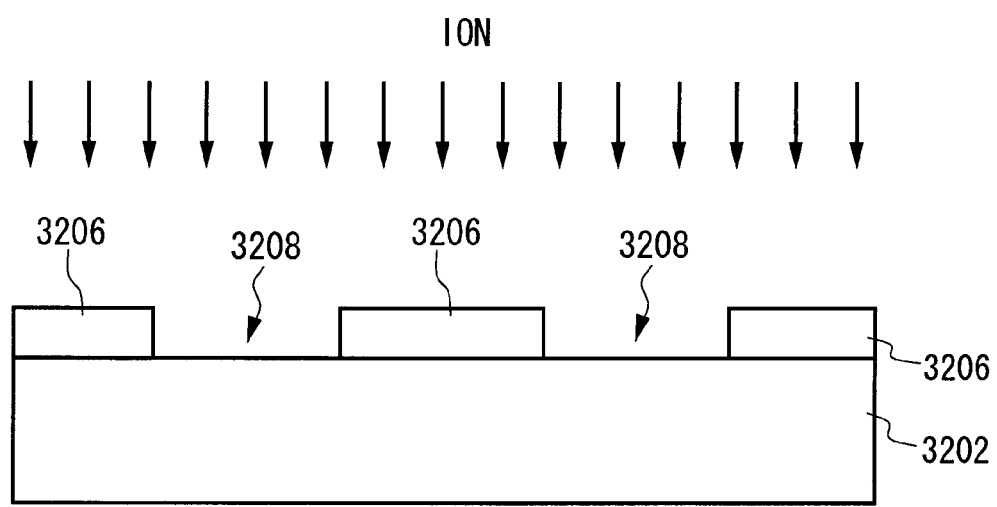
FIG. 32 illustrates a cross section example of the semiconductor wafer 3200 during a production process.
Figure 33:
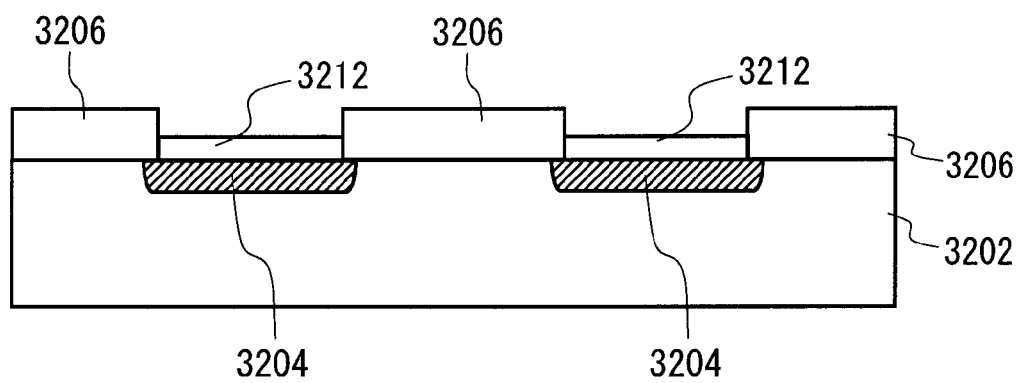
FIG. 33 illustrates another cross section example of the semiconductor wafer 3200 during the production process.

FIGS. 32 and 33 illustrate cross section examples of the semiconductor wafer 3200 during a production process. A method of forming the impurity region in the production process of the semiconductor wafer 3200 is different from that in the production process of the semiconductor wafer 200. In the production process of the semiconductor wafer 200, as illustrated in FIG. 3, after the mask patter 302 used for the formation of the impurity region 204 is provided, the ion-implantation is performed to form the impurity region 204. Whereas in the production process of the semiconductor wafer 3200, the inhibitor 3206 is formed as illustrated in FIG. 32, and ion-implantation is performed using the inhibitor 3206 as a mask pattern to form the impurity region 3204. By producing the semiconductor wafer 3200 in the above-described manner, it is possible to omit the formation of a mask pattern.

According to the above-described embodiments, an impurity region is formed in a silicon wafer and the impurity region serves as wiring that couples the electronic device. In this way, the selective epitaxial region of the compound semiconductor can be used efficiently as possible. More specifically, the number of the wires provided on the surface of the compound semiconductor element forming area can be reduced compared to the conventional one, and therefore it is possible to create more space in the selective epitaxial region. As a result, wiring design can be facilitated on the element surface and therefore the freedom of electrode arrangement can be increased.

Moreover, the selective epitaxial region of the compound semiconductor can be reduced and thereby it is possible to promote the lattice match and the pseudo-lattice-match of the compound semiconductor to the base wafer. Consequently, it is possible to improve the crystallinity of the compound semiconductor formed on the silicon wafer. When the crystallinity of the compound semiconductor is increased, the HBT fabricated in the compound semiconductor has a uniform electric field distribution so that it is possible to enhance the breakdown voltage of the HBT. Moreover, unevenness in the compound semiconductor can be reduced so that planarization in the subsequent device process can be facilitated. Thus, the above-described embodiments are appropriate for the production process of the semiconductor device such as a silicon process that requires microfabrication.

EXAMPLES

Example 1

The semiconductor wafer 2300 was fabricated and the electronic device using the semiconductor wafer 2300 was produced. The semiconductor wafer 2300 includes the base wafer 2302, the inhibitor 2306, the seed body 2312, and the compound semiconductor 2314. An n-type low-resistance Si wafer in which antimony (Sb) is doped as an impurity in the whole of the Si wafer was used as the base wafer 2302. The resistivity of the low-resistance Si wafer was 0.01 Ω·cm.

A silicon oxide layer was formed as the inhibitor 2306 by a thermal oxidation method. The average thickness of the silicon oxide layer was 0.1 µm. A plurality of apertures were formed in a part of the silicon oxide layer by a photolithography method. The size of the aperture was 20 µm×20 µm.

After the apertures were formed in the silicon oxide layer, the base wafer 2302 was placed inside a reaction chamber, and a Ge crystal layer was then formed as the seed body 2312 by a CVD method. The Ge crystal layer was formed selectively in the apertures in the silicon oxide layer. The growth conditions for the Ge crystal layer were a pressure inside the reaction chamber of 2.6 kPa and a temperature of 600° C. The Ge crystal layer was grown to a thickness of 1 µm. Furthermore, the Ge crystal layer is annealed in the reaction chamber. Annealing included two steps, a first annealing was performed at a temperature of 850° C. and for 10 minutes and a second annealing was performed at a temperature of 780° C. and for 10 minutes. After the Ge crystal layer was formed, without taking out the base wafer 2302 from the reaction chamber, the annealing was performed.

After the Ge crystal layer was annealed, a GaAs layer was formed as the compound semiconductor 2314 by a MOCVD method. The GaAs layer was formed using trimethyl gallium and arsine as a source gas under the conditions of a growth temperature of 650° C. and a pressure inside the reaction chamber of 8.0 kPa. The GaAs layer was grown in the aperture using the surface exposed in the aperture in the Ge crystal layer as the seed plane. According to the above-described procedure, the semiconductor wafer 2300 was fabricated.

A heterojunction bipolar transistor (HBT) structure that includes GaAs, InGaP and InGaAs was fabricated on the fabricated semiconductor wafer 2300 by a MOCVD method. Subsequently, photolithography was performed to form a HBT device structure. After that, wires were formed to produce an electronic device.

Figure 34:
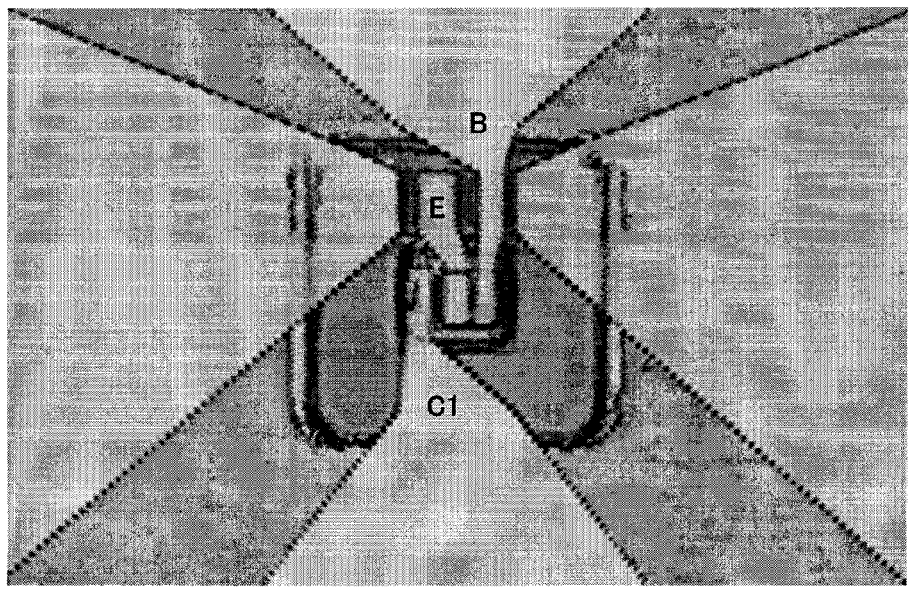
FIG. 34 shows a leaser macrograph of an HBT that is formed using a semiconductor wafer 2300.

FIG. 34 shows a leaser macrograph of the fabricated electronic device from a side of the semiconductor wafer. From the left hand side in the FIG. 34, there are a collector terminal C1, an emitter terminal E and a base terminal B. Moreover, a collector terminal C2 was formed on the back side of the semiconductor wafer. Note that the collector terminal C2 was not shown in the FIG. 34 since the collector terminal C2 was formed on the back side of the wafer.

An HBT operation test in which the operations of the emitter terminal E, the base terminal B and the collector terminal C1 were observed, and another HBT operation test in which the operations of the emitter terminal E, the base terminal B and the collector terminal C2 were observed were conducted. As a result of the operation tests, the correct operation was confirmed in both of the HBT tests.

Figure 35:
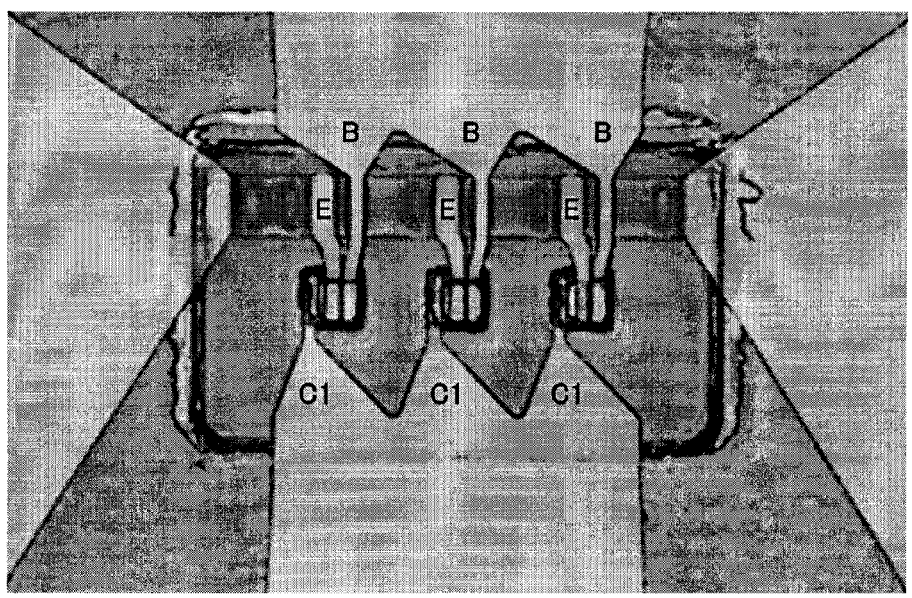
FIG. 35 shows a leaser macrograph of HBTs that are formed in apertures respectively.

FIG. 35 shows a leaser macrograph of HBTs that are formed in apertures respectively. In the same manner as the example shown in FIG. 34, the collector terminal C1, the emitter terminal E and the base terminal B were formed in each HBT, and the collector terminals C1, the emitter terminals E and the base terminals B of the HBTs were connected to each other in parallel. Furthermore, the collector terminals C2 were formed on the back side of the semiconductor wafer. In the same manner as the example shown in FIG. 34, an HBT operation test in which the operation of the emitter terminal E, the base terminal B and the collector terminal C1 were observed, and another HBT operation test in which the operation of the emitter terminal E, the base terminal B and the collector terminal C2 were observed were conducted. The correct operation was confirmed in both of the HBT as a result of the test.

In this way, it was confirmed that the collector terminal C2 provided on the back side of the semiconductor wafer normally functioned. Thus, it was not necessary to provided the collector terminal C1 and a space where used to be occupied by the collector terminal C1 can be effectively used as, for example, an area for extension of wiring.

The surface of the GaAs layer which is the compound semiconductor 2314 was tested by an etch-pit method, and no defects found on the surface of the GaAs layer. The cross section was observed using a transmission electron microscope, and no dislocation that penetrates from the Ge crystal layer, which is the seed body 2312, to the GaAs layer, which is the compound semiconductor layer 2314, was found.

Example 2

In the same manner as Example 1, a silicon oxide was formed as the inhibitor 2306 on a Si wafer, and a plurality of apertures in which the base wafer 2302 was exposed were formed in a part of the inhibitor 2306. The base wafer 2302 was placed inside the reaction chamber, and a Ge crystal layer was then formed as the seed body 2312 by a CVD method. The Ge crystal layer was formed selectively in apertures in the silicon oxide layer. The growth conditions for the Ge crystal layer were set to the same as Example 1. Furthermore, a Ge crystal layer was annealed inside the reaction chamber. The annealing conditions were same as Example 1.

After the Ge crystal layer was annealed, a GaAs layer was formed as the compound semiconductor 2314 by a MOCVD method. The GaAs layer was formed using trimethyl gallium and arsine as source gas. The GaAs crystal was firstly grown at a low temperature of 550° C. and then a high temperature growth of 640° C. was performed to form the GaAs crystal layer. A partial pressure of arsine at the time of the growth of 640° C. was set to 0.05 kPa. Subsequently, using the GaAs layer as a nucleus, a GaAs layer which is a laterally-grown compound semiconductor layer corresponding to the base mesa 838 illustrated in FIG. 8, the base mesa 1138 illustrated in FIG. 11, the base mesa 2038 illustrated in FIG. 19, and the base mesa 2538 illustrated in FIG. 24 was formed. A growth temperature at the lateral growth was 640° C. and a partial pressure of arsine was 0.43 kPa.

Figure 36:
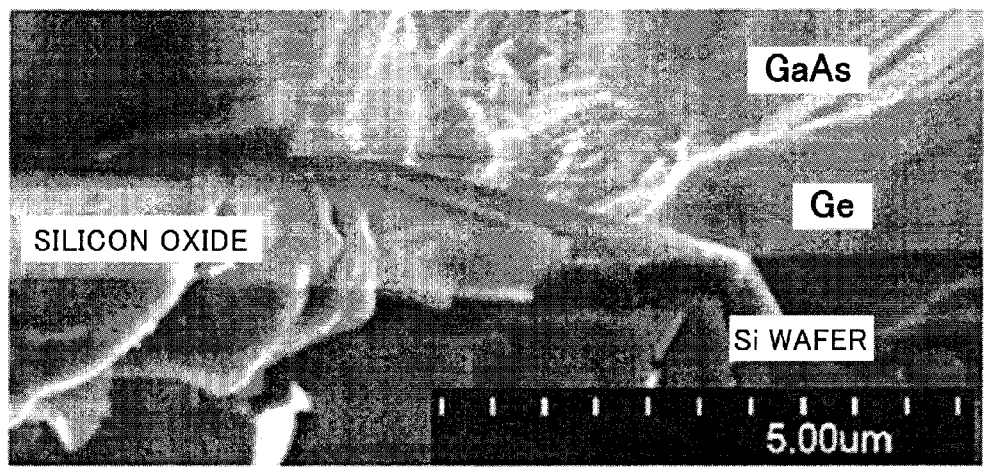
FIG. 36 shows a leaser macrograph of a cross section of crystal.

FIG. 36 shows a macrograph of a cross section of the obtained crystal captured by a scanning electron microscope. From the macrograph, it could be confirmed that the GaAs crystal was grown on the Ge crystal and the GaAs crystal was also laterally grown on the silicon oxide layer that corresponds to the inhibitor 2306. By utilizing the laterally-grown compound semiconductor layer, mesas for a base and the like can be formed by a photolithography method including etching.

While the present invention has been described with reference to the embodiments, the technical scope of the invention is not limited to the above described embodiments. It is apparent to persons skilled in the art that various alterations and improvements can be added to the above-described embodiments. For instance, although the HBT has been illustrated as the compound semiconductor element in the above-described embodiments, the compound semiconductor element can be an FET, HEMT, diode, thyristor, light-emitting element, light-receiving element or the like.

Moreover, in the above-described embodiments, the impurity region 104, the impurity region 204, the impurity region 604, the impurity region 704, the impurity region 804, the impurity region 1104, the impurity region 2004, the impurity region 2604, and the impurity region 3204 (referred to as "the impurity region 104 and so forth") were formed as the impurity region in the base wafer 2302 that contained silicon. However, the impurity region 104 and so forth can be formed in a silicon island pattern on an insulating wafer made of glass, sapphire or the like or on an insulating layer made of silicon oxide, silicon nitride or the like.

Such silicon island can be formed on a silicon oxide layer on an SOT wafer by, for example, etching an SOI layer on the SOI wafer. The silicon island can also be transfer-printed and formed on an insulating wafer or insulating layer by using a nanoimprinting technology. When a silicon element is formed in the silicon island, for example, the well 2603 illustrated in FIG. 25 can be formed as a silicon island. For instance, when a silicon island is formed on silicon oxide, the silicon oxide can serve as the inhibitor so that the seed body and the compound semiconductor can be selectively formed on the silicon island.

The invention claimed is:

1. A semiconductor wafer comprising:
a base wafer that has an impurity region in which an impurity atom has been introduced into silicon;
a plurality of seed bodies provided in contact with the impurity region; and
a plurality of Group 3-5 compound semiconductors each provided in contact with a corresponding seed body and lattice-matched or pseudo-lattice-matched to the corresponding seed body, wherein
the base wafer has a first conductivity type impurity region that contains an impurity atom of a first conductivity type, and
the impurity region has a second conductivity type high-concentration impurity region that contains an impurity atom of a second conductivity type that is opposite to the first conductivity type in a concentration higher than the concentration of the impurity atom of the first conductivity type in the first conductivity type impurity region.

2. The semiconductor wafer according to claim 1, further comprising:
an inhibitor provided on the base wafer and provided with a plurality of apertures in which at least apart of the impurity region is exposed, wherein
the seed bodies are each provided in the apertures respectively;
the inhibitor inhibits crystal growth of the Group 3-5 compound semiconductors.

3. The semiconductor wafer according to claim 1, wherein the base wafer has a silicon region that is mainly made of a silicon atom, and the impurity region is in contact with the silicon region inside the base wafer.

4. The semiconductor wafer according to claim 1, further comprising:
a second conductivity type low-concentration impurity region that contains the impurity atom of the second conductivity type in a concentration lower than the concentration of the second conductivity type impurity region, and that is provided between the first conductivity type impurity region and the second conductivity type high-concentration impurity region.

5. The semiconductor wafer according to claim 1, wherein the impurity region is formed so as to extend from one surface to another surface opposite thereto of the base wafer, the one surface being in contact with the plurality of the seed bodies.

6. The semiconductor wafer according to claim 1, wherein, the plurality of seed bodies each contain $C_xSi_yGe_zSn_{1-x-y-z}$ ($0 \leq x < 1$, $0 \leq y \leq 1$, $0 \leq z \leq 1$, and $0 < x+y+z \leq 1$).

7. The semiconductor wafer according to claim 1, wherein, the base wafer is a Si wafer or an SOI wafer.

8. The semiconductor wafer according to claim 1, wherein, the resistivity of the impurity region is not less than 0.0001 Ω·cm and not more than 1 Ω·m.

9. The semiconductor wafer according to claim 2, further comprising:
a laterally grown compound semiconductor that has been laterally grown on the inhibitor using at least one Group 3-5 compound semiconductor of the plurality of Group 3-5 compound semiconductors as a nucleus.

10. An electronic device comprising:
one or more compound semiconductor elements provided on at least one of the plurality of Group 3-5 compound semiconductors in the semiconductor wafer according to claim 1, wherein
the one or more compound semiconductor elements have a plurality of terminals, and
at least one terminal of the plurality of terminals is electrically coupled to the impurity region via at least one of the seed bodies that are in contact with the compound semiconductor on which the one or more compound semiconductor elements are provided.

11. The electronic device according to claim 10, further comprising:
a first compound semiconductor element provided on a first compound semiconductor of the plurality of Group 3-5 compound semiconductors; and
a second compound semiconductor element provided on a second compound semiconductor of the plurality of Group 3-5 compound semiconductors, the second compound semiconductor being different from the first compound semiconductor, wherein
at least one of the terminals of the first compound semiconductor element is electrically coupled to at least one of the terminals of the second compound semiconductor element via the impurity region.

12. The electronic device according to claim 10, wherein
at least one of the one or more compound semiconductor elements provided on the plurality of Group 3-5 compound semiconductors is a heterojunction bipolar transistor, and
a collector of the heterojunction bipolar transistor is electrically coupled to the impurity region via at least one of the seed bodies.

13. The electronic device according to claim 10, wherein
at least one of the one or more compound semiconductor elements provided on the plurality of Group 3-5 compound semiconductors is a heterojunction bipolar transistor, and
an emitter of the heterojunction bipolar transistor is electrically coupled to the impurity region via at least one of the seed bodies.

14. The electronic device according to claim 11, wherein
at least one of the first compound semiconductor element and the second compound semiconductor element is a heterojunction bipolar transistor of which an emitter, base or collector is a common terminal,
at least one of the first compound semiconductor element and the second compound semiconductor element other than the heterojunction bipolar transistor is a sensor element having a common terminal and an output terminal, and
the common terminal of the heterojunction bipolar transistor is electrically coupled to the common terminal of the sensor element via the impurity region.

15. The electronic device according to claim 14, wherein
the heterojunction bipolar transistor amplifies a signal transmitted from the output terminal of the sensor element.

16. The electronic device according to claim 10, further comprising:
a silicon element provided in a first conductivity type impurity region that is provided in the base wafer and contains an impurity atom of a first conductivity type, the silicon element having a plurality of terminals and including an active region mainly made of a silicon atom, wherein
at least one of the terminals of the silicon element is electrically coupled to at least one of the terminals of the one or more compound semiconductor elements provided on the plurality of the Group 3-5 compound semiconductors via the impurity region.

* * * * *